US011061522B2

(12) United States Patent
Taka et al.

(10) Patent No.: US 11,061,522 B2
(45) Date of Patent: Jul. 13, 2021

(54) INPUT DEVICE, OPERATION DEVICE, AND ELECTRONIC APPARATUS

(71) Applicant: Sony Corporation, Tokyo (JP)

(72) Inventors: Yoshiteru Taka, Kanagawa (JP); Tomoki Kawabata, Kanagawa (JP); Takeshi Koizumi, Miyagi (JP); Takuya Goto, Miyagi (JP)

(73) Assignee: Sony Corporation, Tokyo (JP)

( * ) Notice: Subject to any disclaimer, the term of this patent is extended or adjusted under 35 U.S.C. 154(b) by 156 days.

(21) Appl. No.: 16/083,939

(22) PCT Filed: Mar. 17, 2017

(86) PCT No.: PCT/JP2017/010971
§ 371 (c)(1),
(2) Date: Sep. 11, 2018

(87) PCT Pub. No.: WO2017/164130
PCT Pub. Date: Sep. 28, 2017

(65) Prior Publication Data
US 2020/0293151 A1 Sep. 17, 2020

(30) Foreign Application Priority Data
Mar. 24, 2016 (JP) .............................. JP2016-060757

(51) Int. Cl.
G06F 3/044 (2006.01)
G01L 1/14 (2006.01)
(Continued)

(52) U.S. Cl.
CPC ............ *G06F 3/0447* (2019.05); *G01L 1/144* (2013.01); *G06F 3/0485* (2013.01); *G06F 3/0488* (2013.01)

(58) Field of Classification Search
CPC .... G06F 3/0447; G06F 3/0485; G06F 3/0488; G01L 1/144; G01L 5/00;
(Continued)

(56) References Cited
U.S. PATENT DOCUMENTS
7,060,924 B1 6/2006 Beene
2010/0084251 A1 4/2010 Rajagopal
(Continued)

FOREIGN PATENT DOCUMENTS
JP H07-29729 U 6/1995
JP 2003-187671 7/2003
(Continued)

OTHER PUBLICATIONS
International Search Report and Written Opinion issued in connection with International Patent Application No. PCT/JP2017/010971, dated Jun. 20, 2017. (10 pages).

*Primary Examiner* — Rodney Amadiz
(74) *Attorney, Agent, or Firm* — K&L Gates LLP

(57) ABSTRACT
An input device includes a pressure-sensitive sensor including a first sensing unit and a second sensing unit, and a pressing unit that is disposed on the pressure-sensitive sensor and undergoes buckling deformation. A bottom of the pressing unit is disposed on the first sensing unit, and a top of the pressing unit is disposed on the second sensing unit.

18 Claims, 20 Drawing Sheets

(51) Int. Cl.
*G06F 3/0485* (2013.01)
*G06F 3/0488* (2013.01)

(58) Field of Classification Search
CPC ........ H03K 2217/96054; H03K 2217/960755; H03K 17/975; H01H 13/00; H01H 13/66; H01H 36/00
See application file for complete search history.

(56) References Cited

U.S. PATENT DOCUMENTS

| | | | |
|---|---|---|---|
| 2011/0083946 A1* | 4/2011 | Niiyama | H01H 25/002 200/16 C |
| 2015/0090579 A1 | 4/2015 | Kurikawa | |
| 2019/0138125 A1* | 5/2019 | Zeng | A41D 15/04 |

FOREIGN PATENT DOCUMENTS

| | | |
|---|---|---|
| JP | 2003-187671 A | 7/2003 |
| JP | 2014-220130 | 11/2014 |
| JP | 2014-220130 A | 11/2014 |
| WO | 2013/187397 A1 | 12/2013 |

* cited by examiner

A

B

A

B

A

B

C

A

B

A

B

A

B

A

B

INPUT DEVICE, OPERATION DEVICE, AND ELECTRONIC APPARATUS

CROSS-REFERENCE TO RELATED APPLICATIONS

The present application claims the benefit of International Application No. PCT/JP2017/010971, filed Mar. 17, 2017, which claims priority to Japanese Application No. 2016-060757, filed Mar. 24, 2016, the disclosures of which are incorporated herein by reference.

BACKGROUND

The present technology relates to an input device, an operation device including the input device, and an electronic apparatus including the input device. Specifically, the present technology relates to an input device for detecting an operation by a pressure-sensitive sensor.

BACKGROUND ART

An input device capable of performing two kinds of operations with the same pressing unit is required. For example, Patent Document 1 has proposed an operation switch sheet member including a pressing operation unit operable by a pressing operation on a surface operation unit, and an electrostatic capacitance detection unit capable of detecting a contact operation on the surface operation unit as a change in electrostatic capacitance.

SUMMARY

Problems to be Solved by the Invention

An object of the present technology is to provide an input device capable of performing two kinds of operations with the same pressing unit, an operation device including the input device, and an electronic apparatus including the input device.

Solutions to Problems

In order to solve the above-described problem, a first technique is an input device including a pressure-sensitive sensor including a first sensing unit and a second sensing unit, and a pressing unit that is disposed on the pressure-sensitive sensor and undergoes buckling deformation, in which a bottom of the pressing unit is disposed on the first sensing unit, and a top of the pressing unit is disposed on the second sensing unit.

A second technique is an operation device including the input device of the first technique.

A third technique is an electronic apparatus including the input device of the first technique.

A fourth technique is an electronic apparatus including an operation device including an input device, and a host apparatus that operates on the basis of an output signal from the operation device, in which the input device includes a pressure-sensitive sensor including a first sensing unit and a second sensing unit, and a pressing unit that is disposed on the pressure-sensitive sensor and undergoes buckling deformation, a bottom of the pressing unit is disposed on the first sensing unit, and a top of the pressing unit is disposed on the second sensing unit.

Effects of the Invention

As described above, according to the present technology, it is possible to realize an input device capable of performing two kinds of operations with the same pressing unit.

Figure 10:
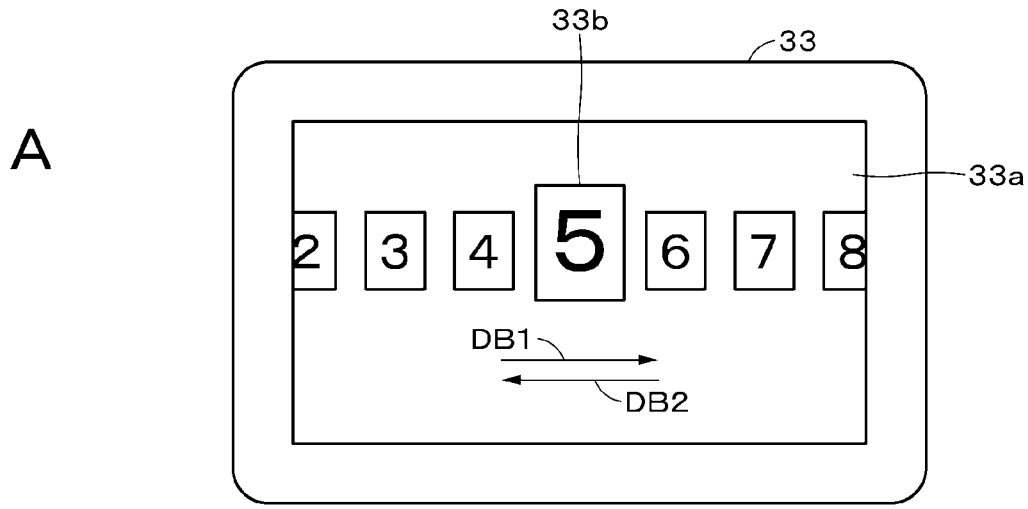
Figure 10:
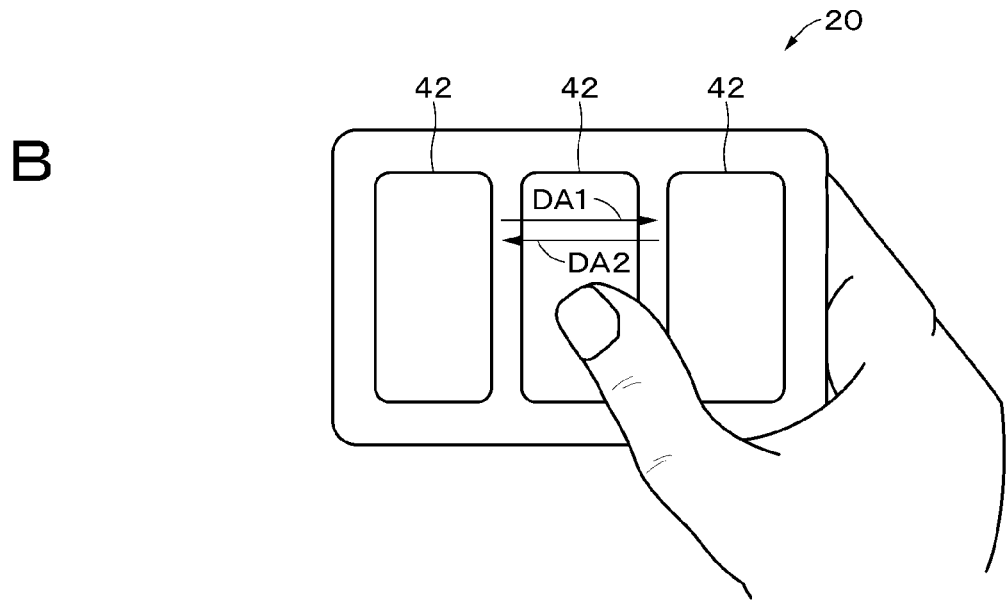
Figure 10:
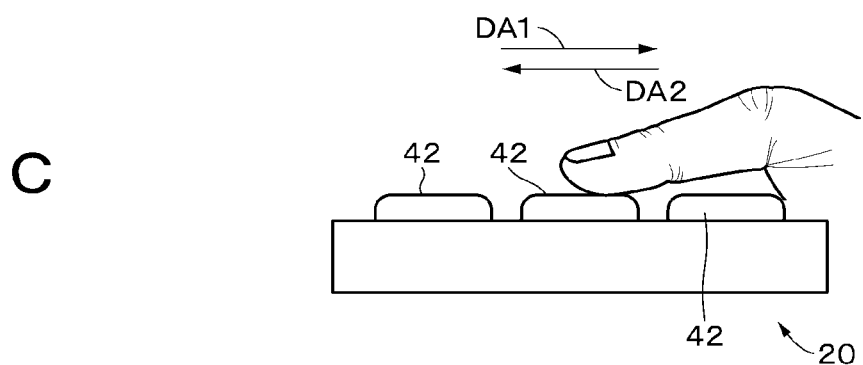

Each of FIGS. 10A, 10B, and 10C is a schematic diagram for explaining a scrolling operation.

Figure 11:
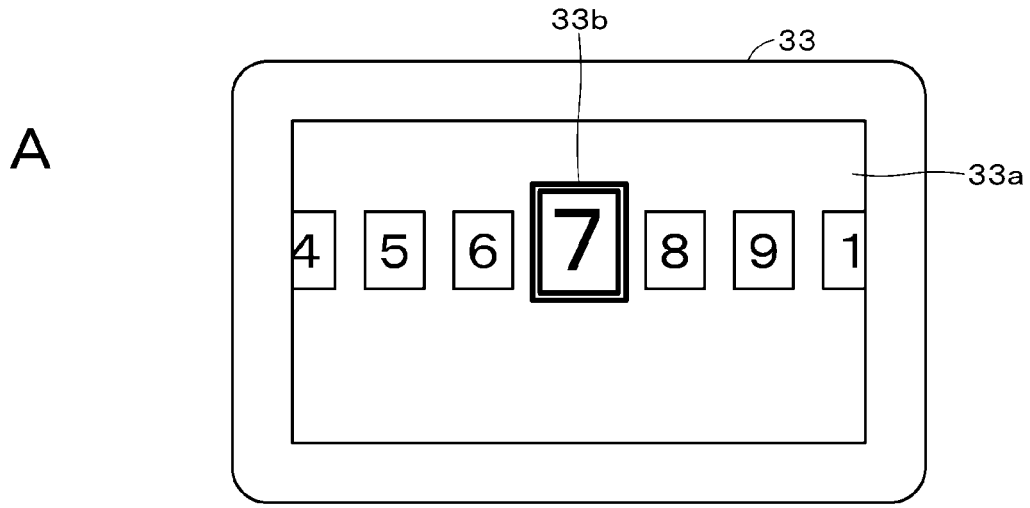
Figure 11:
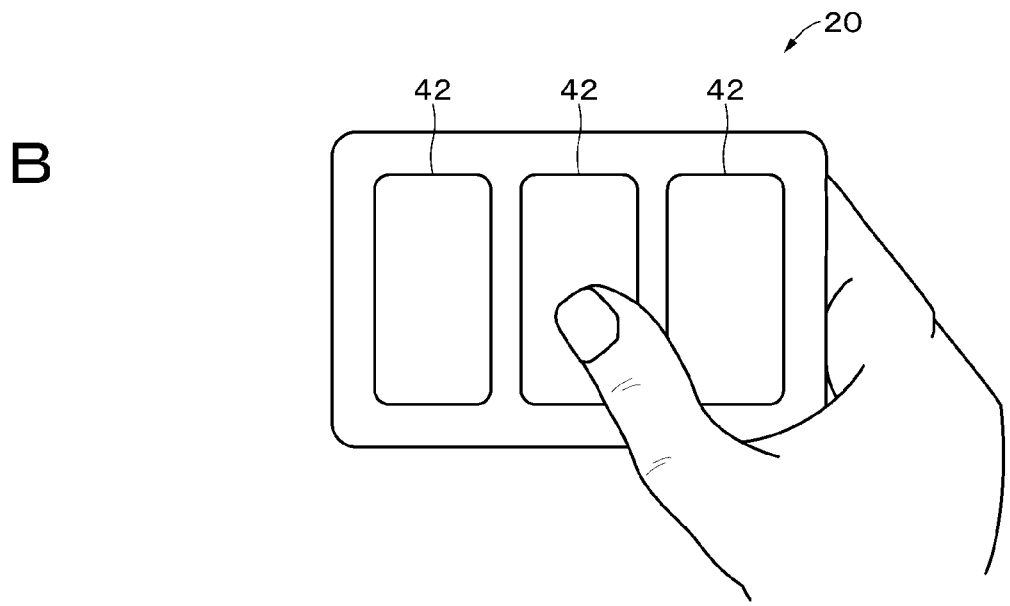
Figure 11:
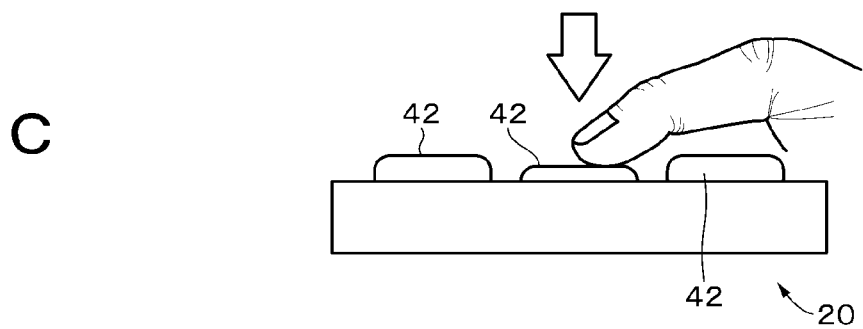

Each of FIGS. 11A, 11B, and 11C is a schematic diagram for explaining a determination operation.

Figure 12:
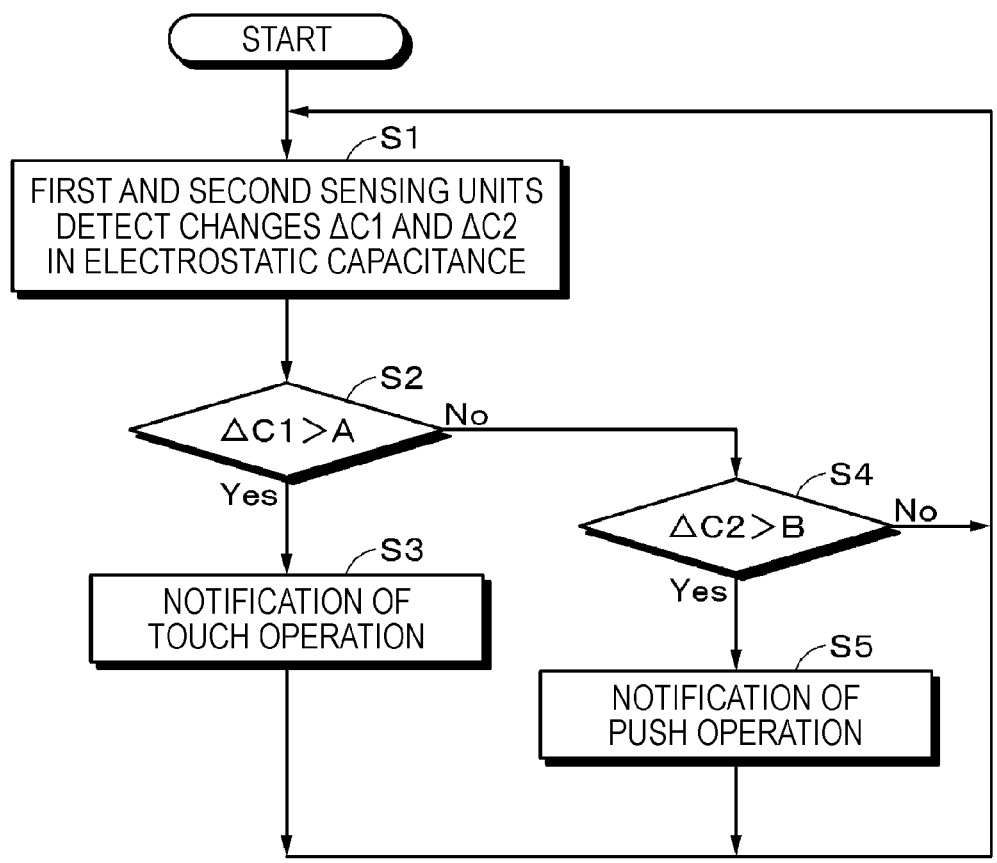

FIG. 12 is a flowchart for explaining an operation of a controller IC of an input device.

Figure 13:
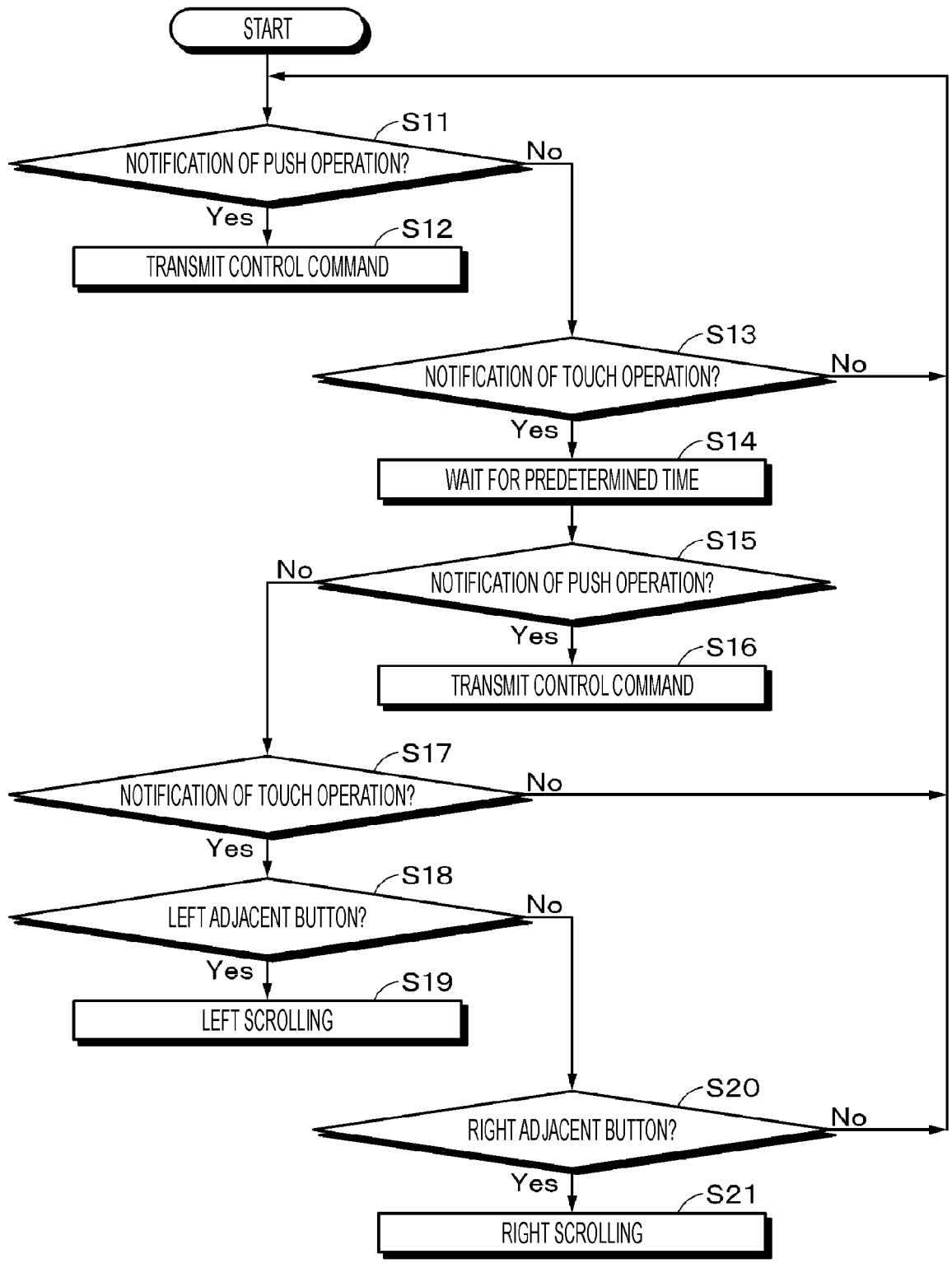

FIG. 13 is a flowchart for explaining an operation of a control unit of an operation device.

Figure 14:
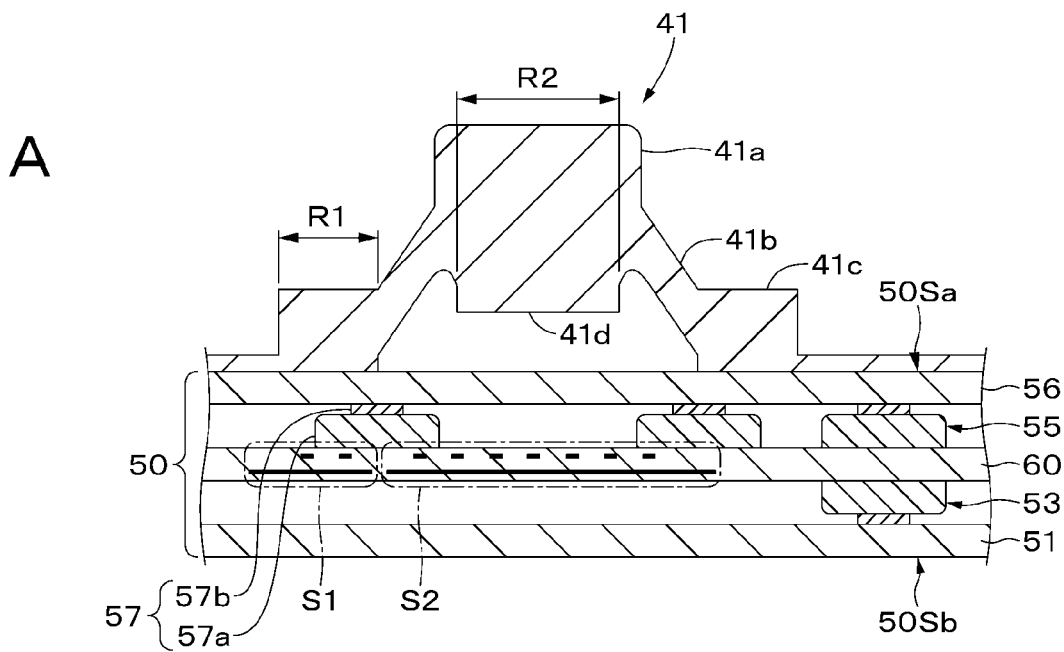
Figure 14:
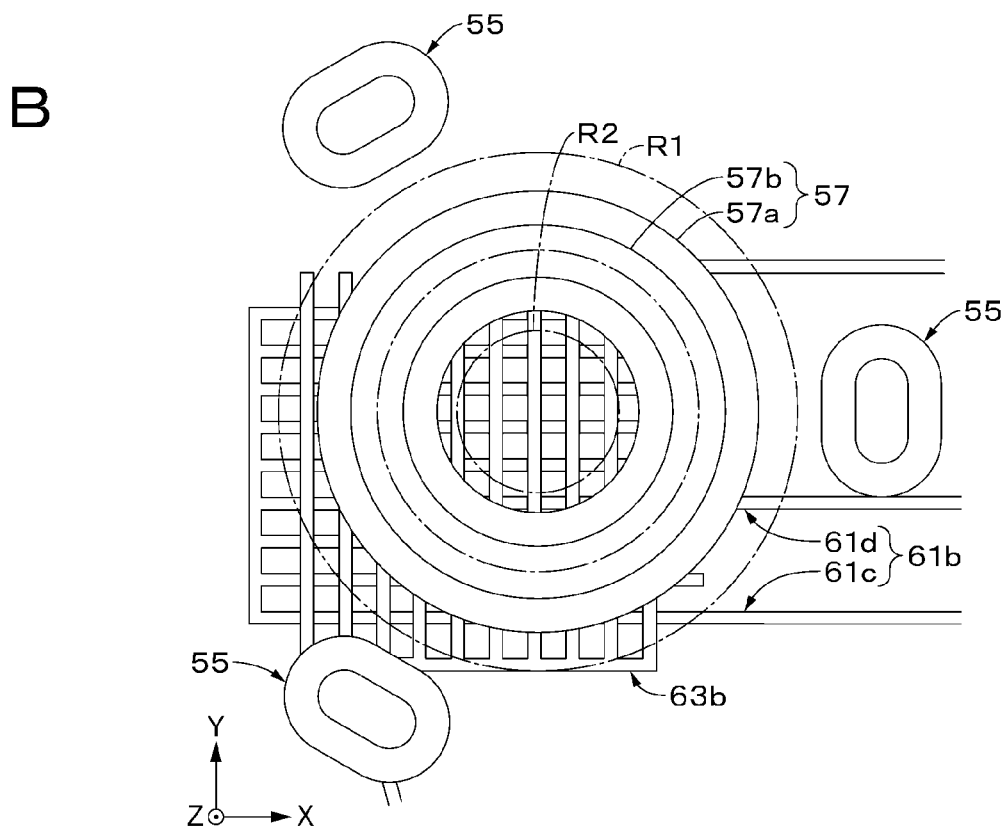

FIG. 14A is a cross-sectional view illustrating a configuration of a pressure-sensitive sensor. FIG. 14B is a plan view illustrating disposition of a structure unit of the pressure-sensitive sensor.

Figure 15:
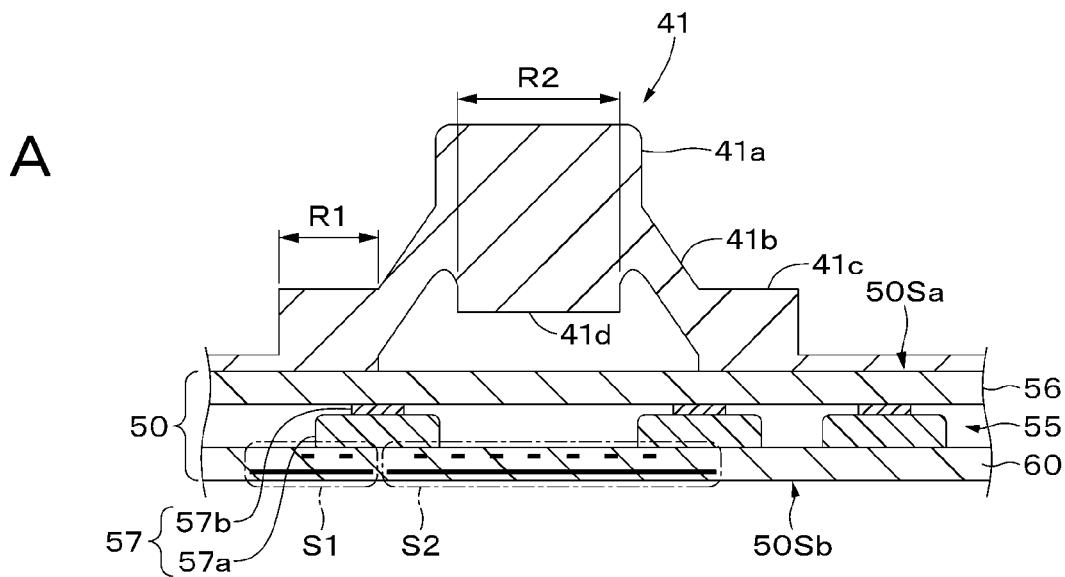
Figure 15:
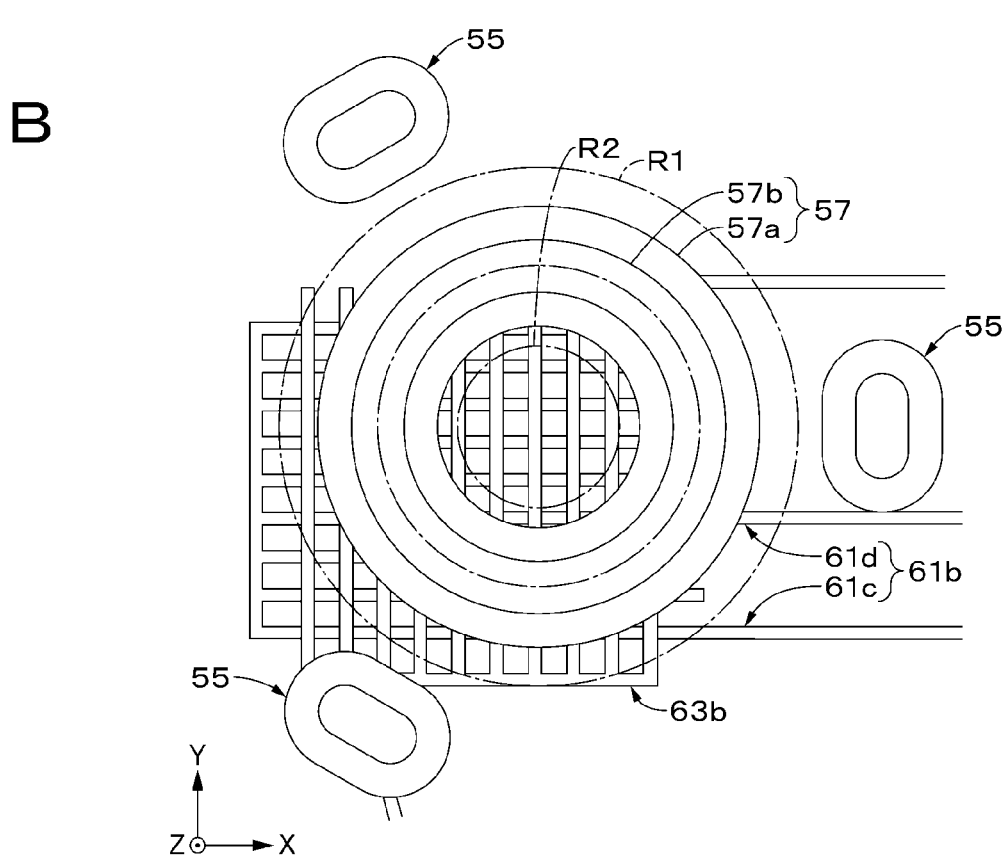

FIG. 15A is a cross-sectional view illustrating a configuration of a pressure-sensitive sensor. FIG. 15B is a plan view illustrating disposition of a structure unit of the pressure-sensitive sensor.

Figure 16:
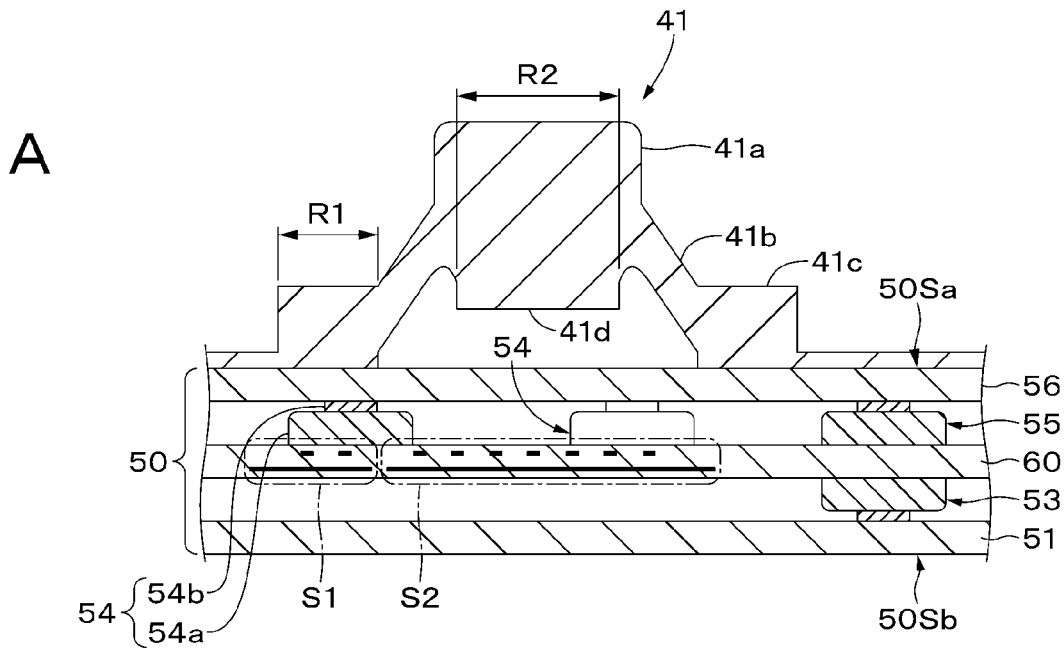
Figure 16:
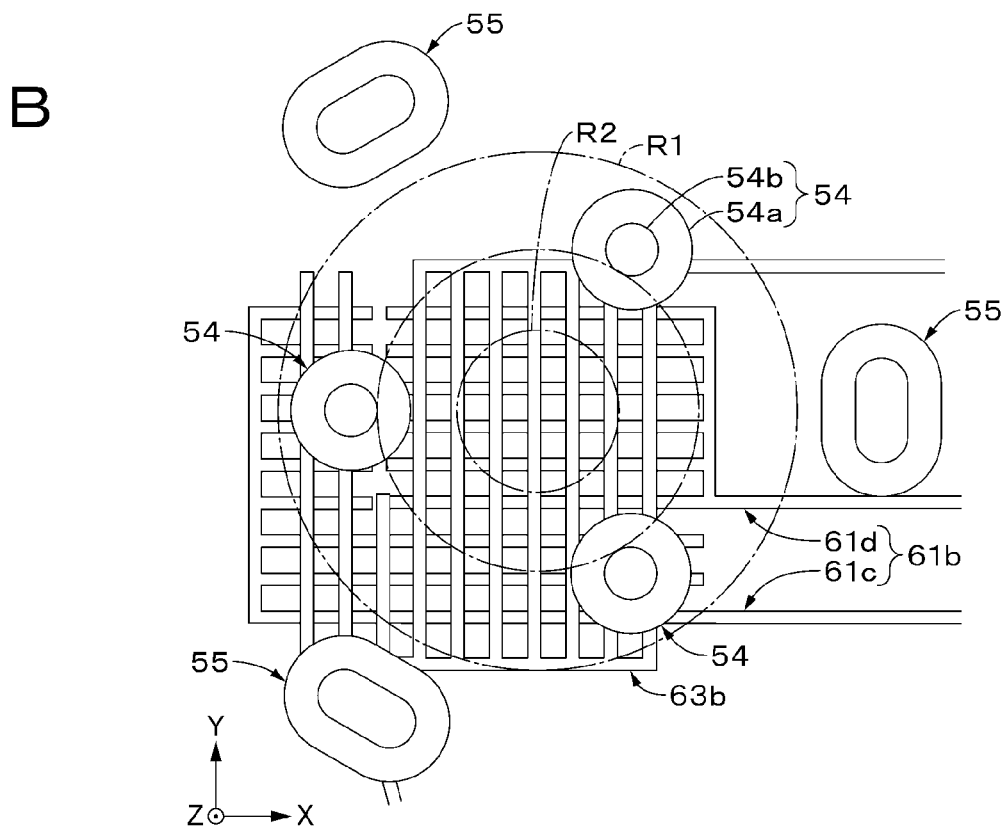

FIG. 16A is a cross-sectional view illustrating a configuration of a pressure-sensitive sensor. FIG. 16B is a plan view illustrating disposition of a structure unit of the pressure-sensitive sensor.

Figure 17:
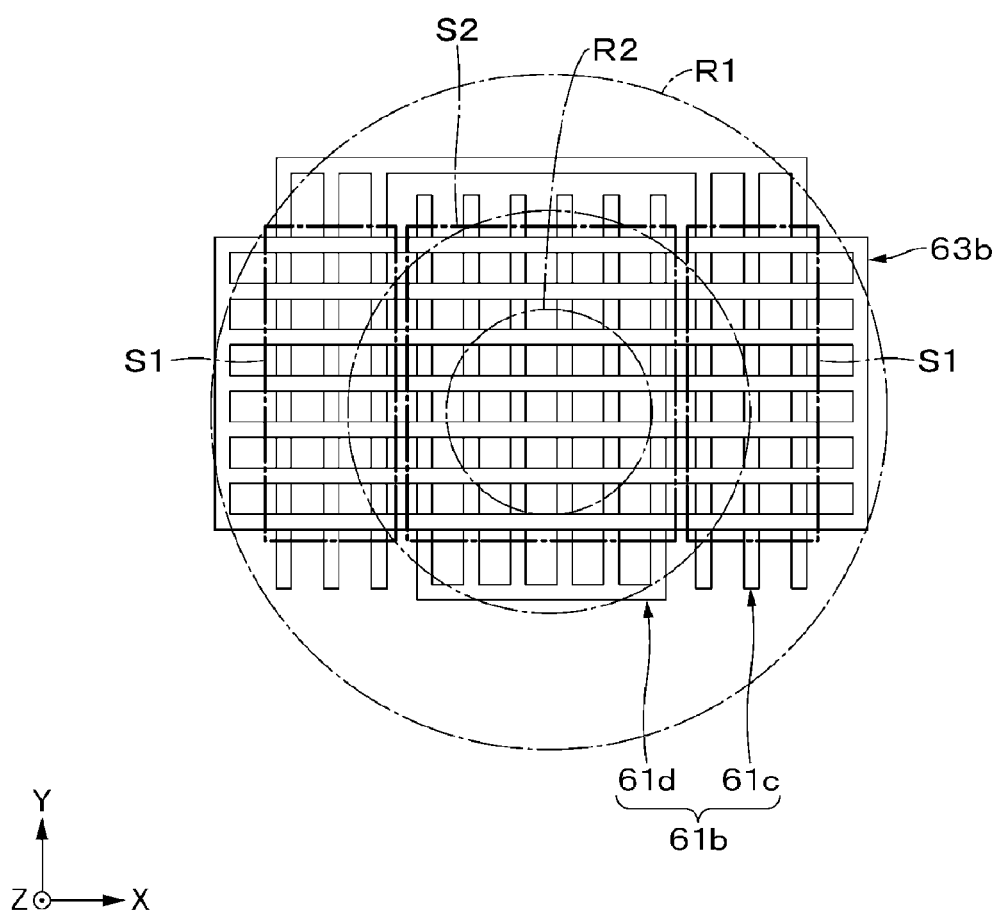

FIG. 17 is a plan view illustrating a configuration of first and second sensing units.

Figure 18:
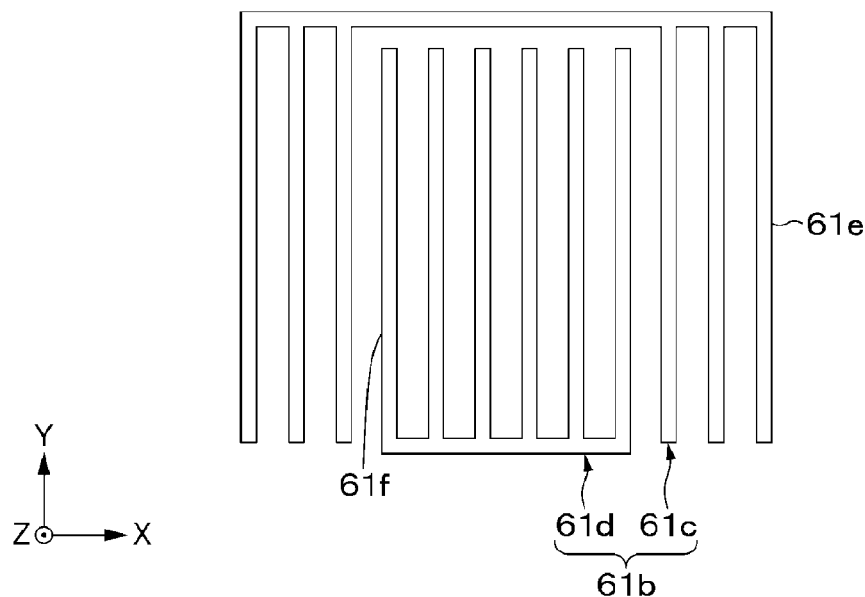
Figure 18:
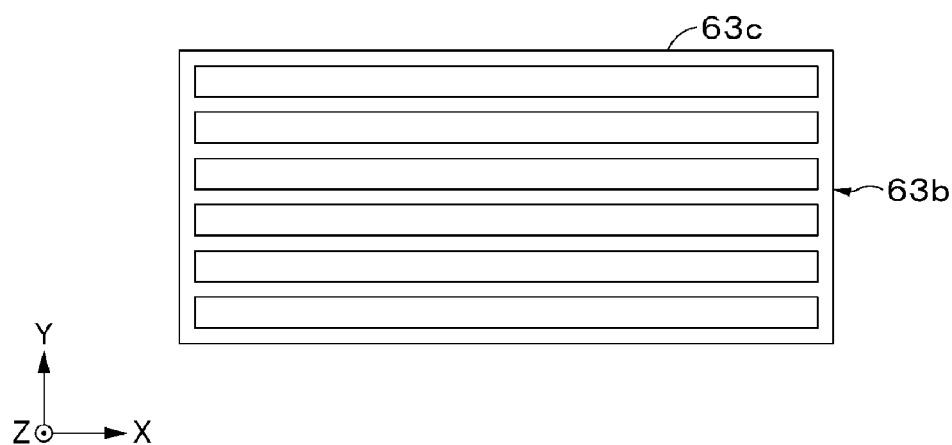

FIG. 18A is a plan view illustrating a configuration of a first electrode. FIG. 18B is a plan view illustrating a configuration of a second electrode.

Figure 19:
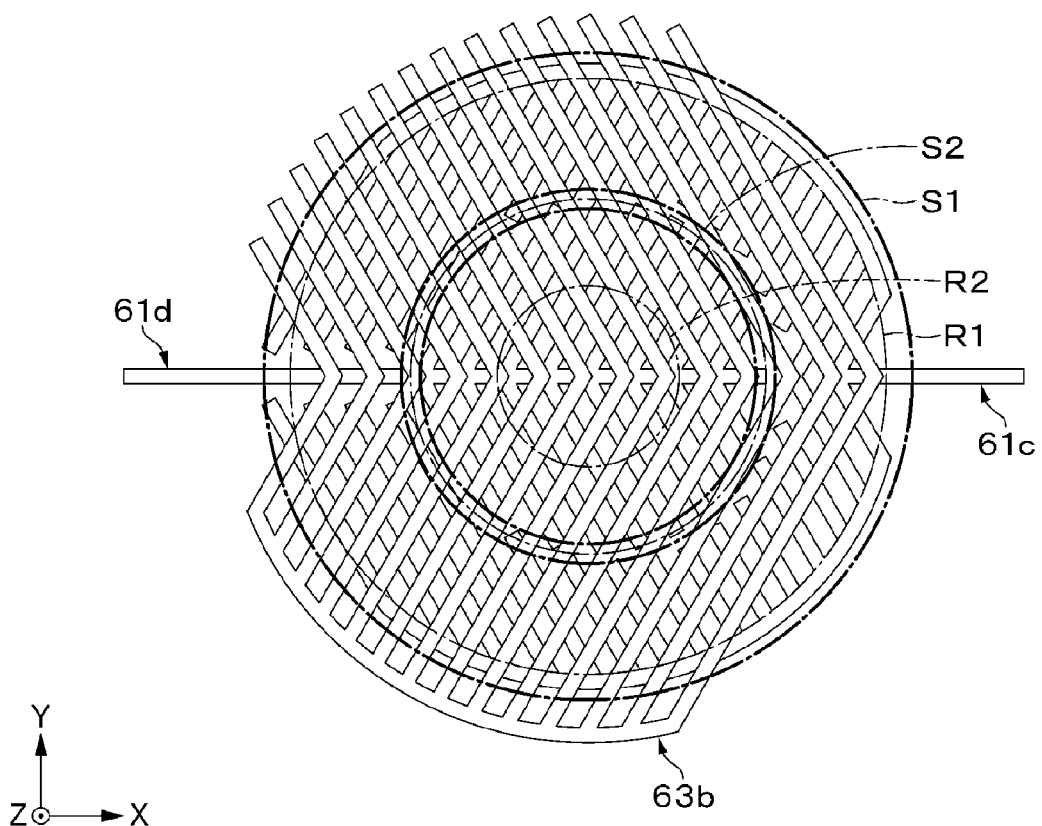

FIG. 19 is a plan view illustrating a configuration of first and second sensing units.

Figure 20:
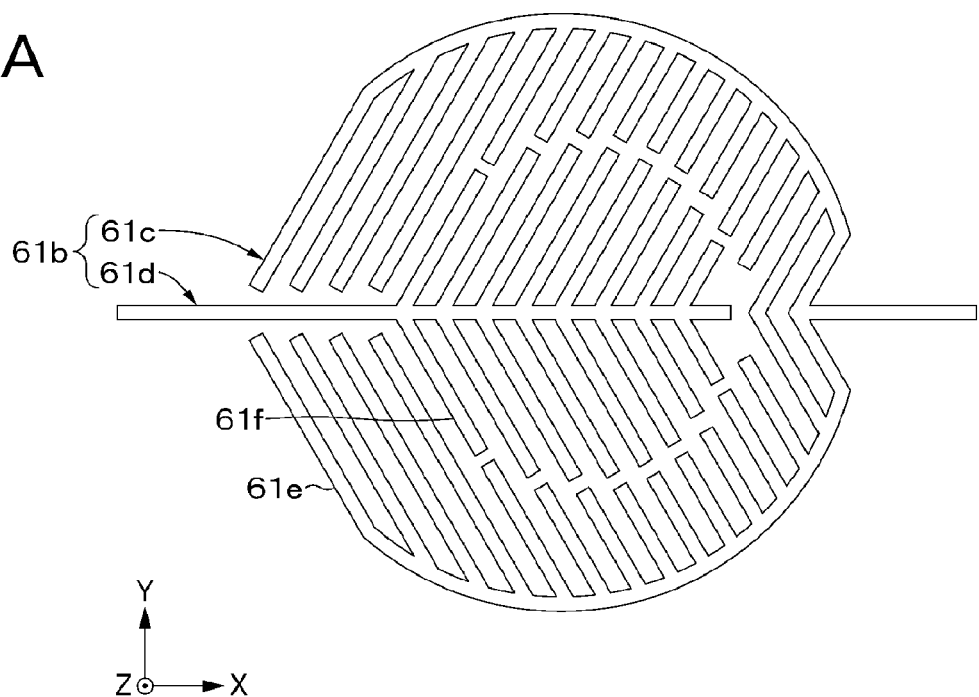
Figure 20:
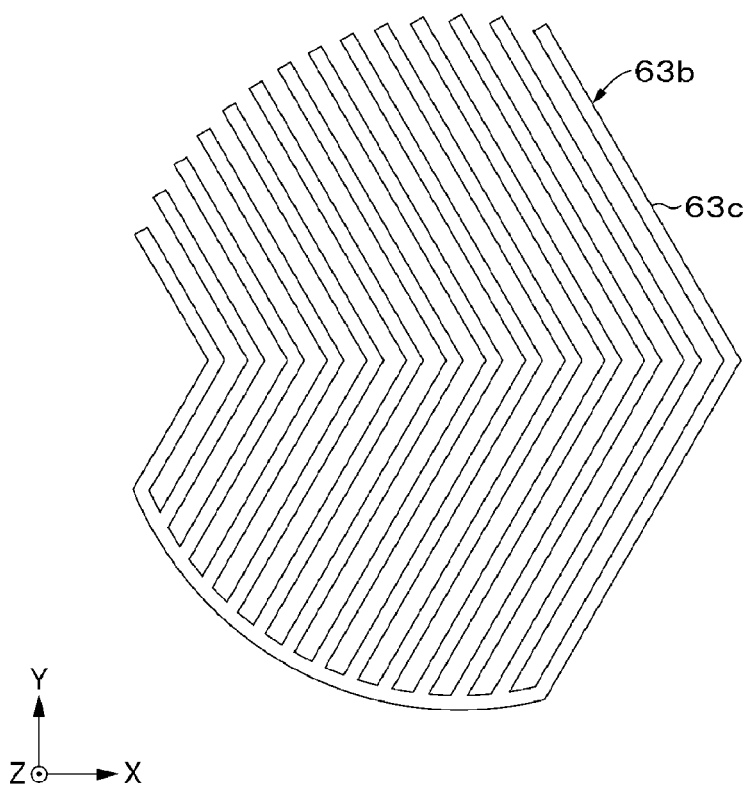

FIG. 20A is a plan view illustrating a configuration of a first electrode. FIG. 20B is a plan view illustrating a configuration of a second electrode.

Figure 21:
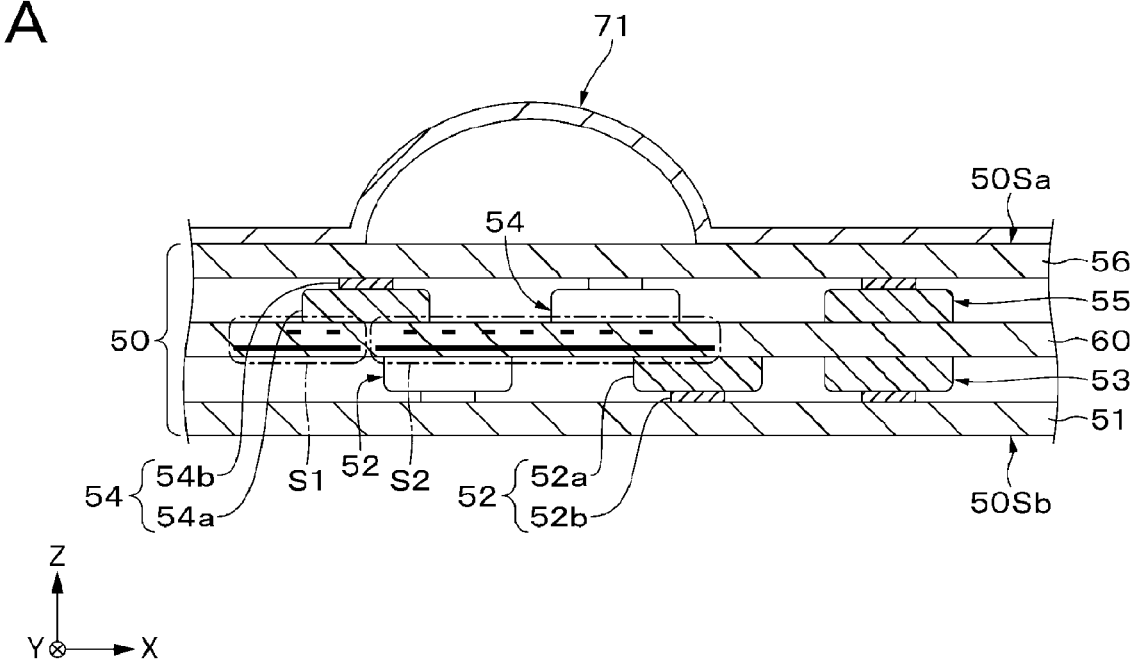
Figure 21:
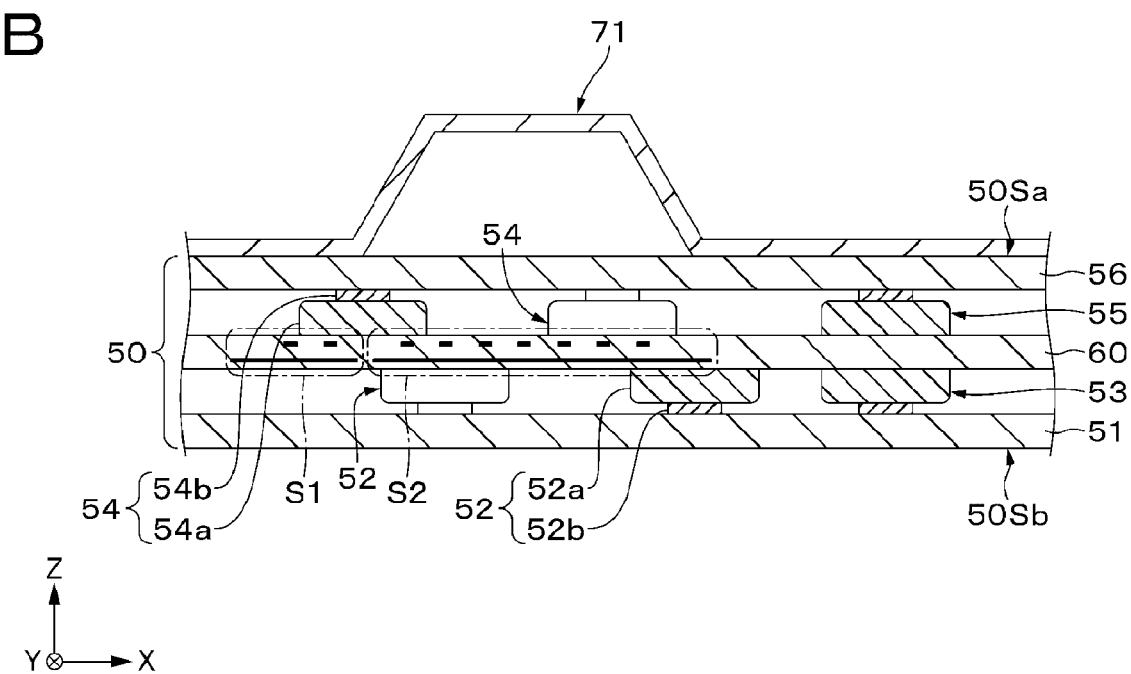

Each of FIGS. 21A and 21B is a cross-sectional view illustrating a configuration of a pressing unit.

DETAILED DESCRIPTION

Embodiments of the present technology will be described in the following order.
1 Configuration of electronic apparatus
2 Configuration of input device
3 Outline of operation of electronic apparatus
4 Operation of controller IC of input device
5 Operation of control unit of operation device
6 Effect
7 Modified Example

1 Configuration of Electronic Apparatus

Figure 1:
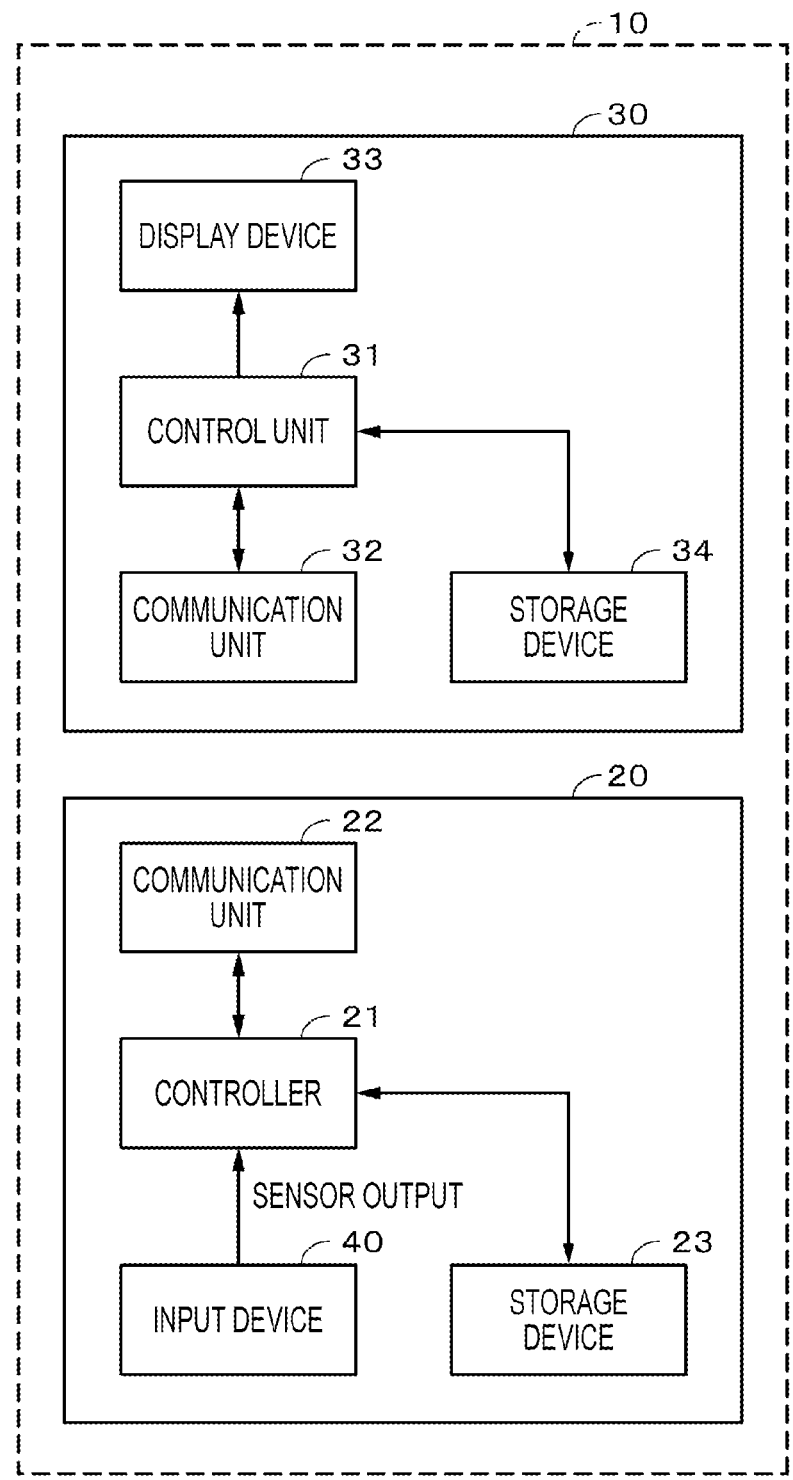
FIG. 1 is a block diagram illustrating a configuration of an electronic apparatus according to an embodiment of the present technology.

As illustrated in FIG. 1, an electronic apparatus 10 according to an embodiment of the present technology is a so-called television device, and includes an operation device 20 and a host apparatus 30 serving as a main body of the electronic apparatus 10.

Operation Device

The operation device 20 is a so-called remote control device, and includes an input device 40, a control unit 21, a communication unit 22, and a storage device 23.

The input device 40 can perform two kinds of input operations, that is, a touch operation (first pressing operation) and a push operation (second pressing operation) with the same button (pressing unit). As described below, the input device 40 includes a plurality of buttons, and in a case where a touch operation is performed on any one of the buttons, the input device 40 notifies the control unit 21 on which button the touch operation has been performed. In addition, in a case where a push operation is performed on any one of the buttons, the input device 40 notifies the control unit 21 on which button the push operation has been performed.

The control unit 21 controls the entire operation device 20. On the basis of the notification from the input device 40, the control unit 21 outputs a control command as control information to the host apparatus 30 via the communication unit 22. Specifically, in a case where the control unit 21 is notified of the push operation by the input device 40, the control unit 21 reads a control command corresponding to a button on which the push operation has been performed from the storage device 23, and outputs the control command to the host apparatus 30. In a case where the control unit 21 is notified of the touch operation by the input device 40, the control unit 21 judges whether or not a swipe operation has been performed. At this time, the judgment on the swipe operation is made on the basis of whether or not the previous touch operation has been performed within a predetermined time on a button adjacent to the button for which notification of the touch operation has been made this time. Then, in a case where the control unit 21 judges that the swipe operation has been performed, the control unit 21 reads a control command corresponding to the swipe operation from the storage device 23, and outputs the control command to the host apparatus 30.

The communication unit 22 communicates with the host apparatus 30 according to a predetermined wireless communication standard such as Bluetooth (registered trademark) to exchange information.

The storage device 23 includes a memory device including a read only memory (ROM) and a random access memory (RAM), develops a program code stored in the ROM on the RAM, and executes a predetermined process. The storage device 23 stores various control commands (control information) for operating a host apparatus, specifically a control command corresponding to each button, a control command corresponding to a swipe operation, and the like.

Host Apparatus

The host apparatus 30 includes a control unit 31, a communication unit 32, a display device 33, and a storage device 34. The control unit 31 executes various processes on the basis of a control command supplied from the operation device 20 via the communication unit 32. For example, on the basis of a control command supplied from the operation device 20, the control unit 31 executes an operation associated with each button (for example, a power on/off operation, a display menu selection operation, or a volume change operation), or executes a screen display operation on the screen display device 33 (for example, a scrolling operation of a display screen or a movement operation of a cursor).

The communication unit 32 communicates with the operation device 20 according to a predetermined wireless communication standard such as Bluetooth (registered trademark) to exchange information.

The display device 33 displays an image (screen) on the basis of a video signal, a control signal, and the like supplied from the control unit 31. Examples of the display device 33 include a liquid crystal display, an electro luminescence (EL) display, and a plasma display panel (PDP), but are not limited thereto.

The storage device 34 includes a memory device including a ROM and a RAM, develops a program code stored in the ROM on the RAM, and executes a predetermined process.

2 Configuration of Input Device

Figure 2:
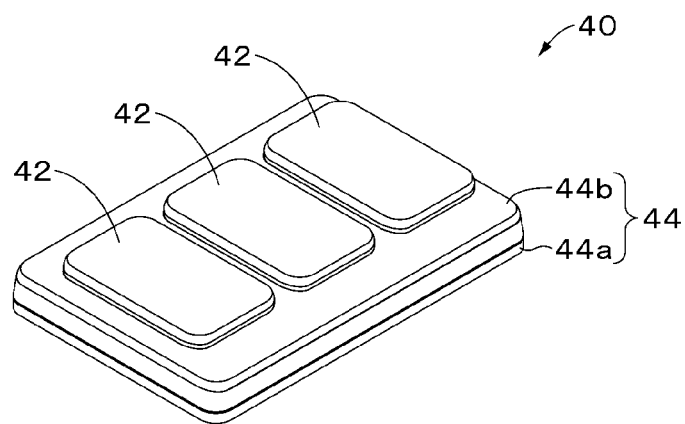
FIG. 2A is a perspective view illustrating an appearance of an operation device according to an embodiment of the present technology.
FIG. 2B is an exploded perspective view illustrating the configuration of the operation device according to the embodiment of the present technology.
Figure 2:
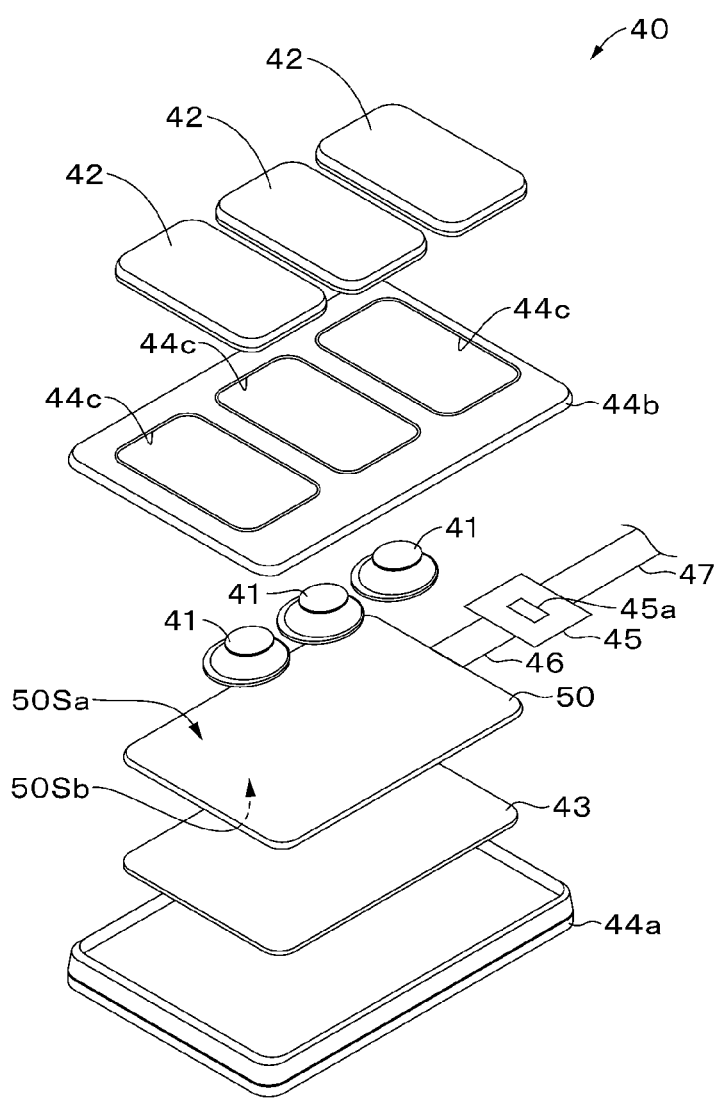

As illustrated in FIGS. 2A and 2B, the input device 40 includes a pressure-sensitive sensor 50, a plurality of pressing units 41, a plurality of buttons 42, a support 43, and a housing 44. The pressure-sensitive sensor 50 is connected to a substrate 45 via a flexible printed circuit (FPC) 46. On the substrate 45, a controller integrated circuit (IC) 45a which is a control unit of the pressure-sensitive sensor 50 is mounted. The substrate 45 is connected to the control unit 21 of the input device 40 via a cable 47 of a predetermined transmission standard such as a universal serial bus (USB).

A plurality of pressing units 41 is disposed on a sensing surface 50Sa of the pressure-sensitive sensor 50, and the buttons 42 are disposed on tops of the pressing units 41, respectively. Meanwhile, the support 43 is disposed on a back surface 50Sb opposite to the sensing surface 50Sa.

Each of the above-described components of the input device 40 is housed in a housing 44. The housing 44 includes housings 44a and 44b, and the housings 44a and 44b are combined with each other such that an inner peripheral surface of a peripheral wall of the housing 44b is fitted to an outer peripheral side of a peripheral wall of the housing 44a. The housing 44b has a plurality of openings 44c, and an operation surface of each of the buttons 42 is exposed from each of the openings 44c.

Pressing Unit

Figure 3:
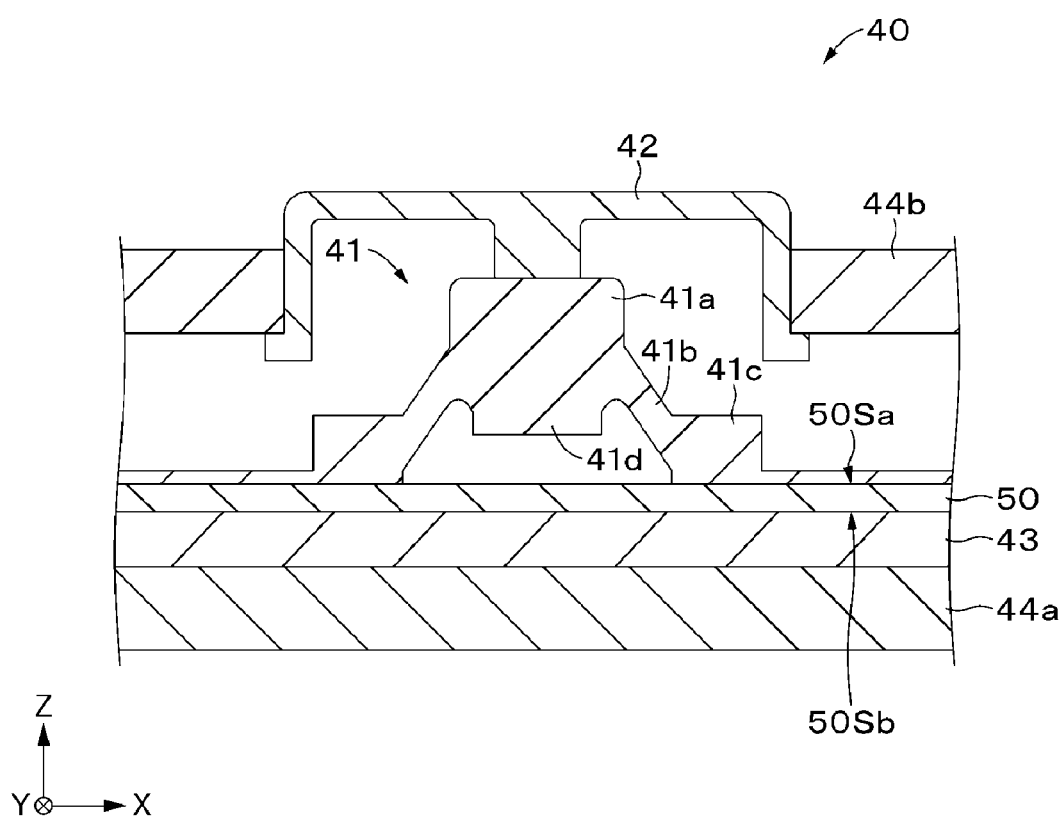
FIG. 3 is a cross-sectional view illustrating a configuration of an input device according to an embodiment of the present technology.

The pressing unit 41 is a so-called rubber contact, has a hollow dome shape with a bottom opened as illustrated in FIG. 3, and undergoes buckling deformation during a push operation. The pressing unit 41 includes a pusher 41a, a buckling unit 41b for supporting the pusher 41a, a bottom 41c for fixing the pressing unit 41 to the sensing surface 50Sa, and a protruding portion 41d protruding toward the pressure-sensitive sensor 50 on the back side (side corresponding to the pressure-sensitive sensor 50) of the pusher 41a. A bottom surface of the bottom 41c may be bonded to the sensing surface 50Sa of the pressure-sensitive sensor 50 via an adhesive layer (not illustrated) such as a pressure-sensitive adhesive layer. Here, the pressure-sensitive adhesion is defined as a kind of adhesion. According to this definition, the pressure-sensitive adhesive layer is regarded as one kind of adhesive layer. The pressing unit 41 is constituted by an elastic body. The elastic body is a rubber-based resin such as a silicone rubber, for example.

When a load applied to the pressing unit 41 is gradually increased, a deformation pattern of the buckling unit 41b suddenly changes with a certain load (hereinafter referred to as a "buckling load") to generate a large deflection. Here, the "touch operation" means an operation in a case where the button 42 (that is, the pressing unit 41) is pressed with a load less than a buckling load (hereinafter referred to as a "light load"). The "push operation" means an operation (pushing operation) in a case where the button 42 (that is, the pressing unit 41) is pressed with a load equal to or more than a buckling load (hereinafter referred to as a "heavy load").

The buckling unit 41b is a buckling wall having a conical shape expanding in a direction from a top of the pressing unit 41 toward a lower portion thereof. Incidentally, one or more through holes may be formed in the buckling unit 41b, or the buckling unit 41b may include a plurality of legs for supporting the pusher 41a. The protruding portion 41d presses the pressure-sensitive sensor 50 during buckling deformation of the pressing unit 41.

Pressure-Sensitive Sensor

The pressure-sensitive sensor 50 is an electrostatic capacitance type sensor having a film shape or a plate shape, detects a change in electrostatic capacitance (pressure) according to an input operation, and outputs an electric signal corresponding to the change to the controller IC 45a. Here, the film also includes a sheet.

Figure 4:
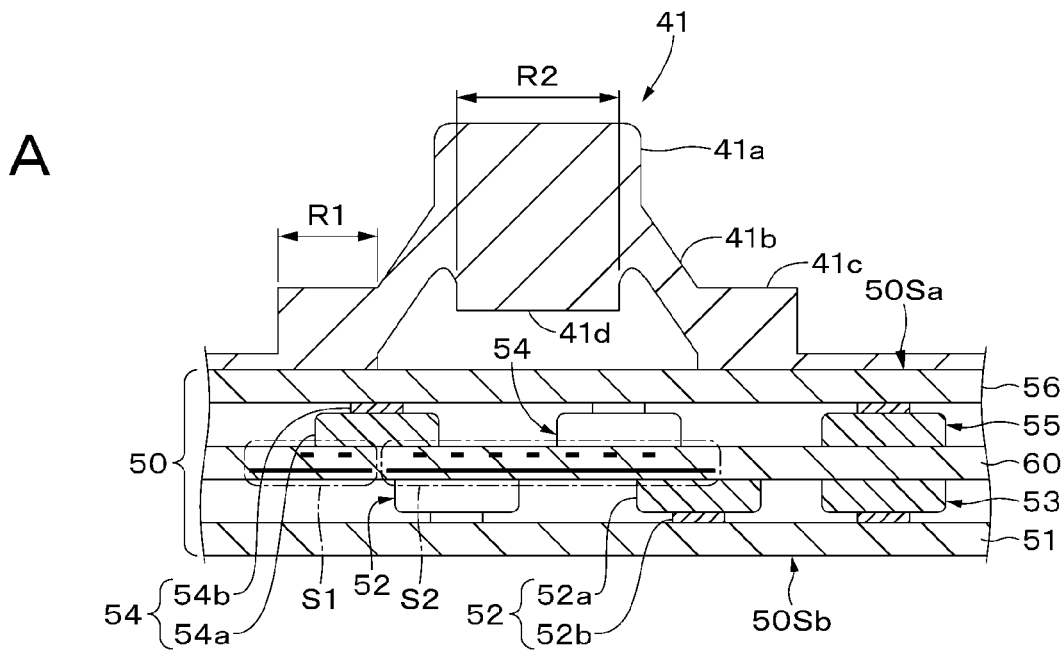
FIG. 4A is a cross-sectional view illustrating a configuration of a pressure-sensitive sensor.
FIG. 4B is a plan view illustrating disposition of a structure unit of the pressure-sensitive sensor.
Figure 4:
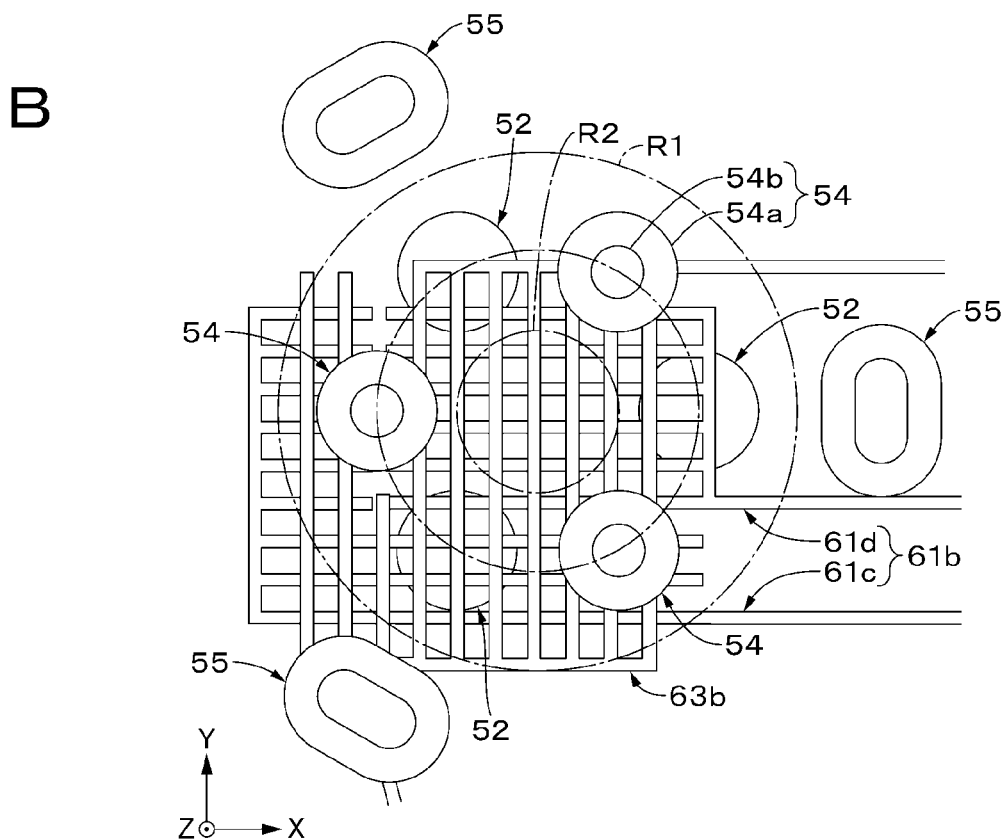

As illustrated in FIG. 4A, the pressure-sensitive sensor 50 includes a first sensing unit S1 and a second sensing unit S2. The bottom 41c of the pressing unit 41 is disposed on the first sensing unit S1, and the pusher (top) 41a of the pressing unit 41 is disposed on the second sensing unit S2.

The first sensing unit S1 is disposed in a first region R1, and the second sensing unit S2 is disposed in a second region R2. The first region R1 indicates a region (pressing region of light load) pressed by the bottom 41c of the sensing surface 50Sa with a light load during a touch operation. In addition, the second region R2 indicates a region (pressing region of heavy load) pressed by the protruding portion 41d of the sensing surface 50Sa during a push operation.

As illustrated in FIG. 4A, the pressure-sensitive sensor 50 includes a conductor base material 51, a plurality of structures 52 and 53, a sensor layer 60, a plurality of structures 54 and 55, and a conductor base material 56. Hereinafter, one of both main surfaces of a component (constituent member) of the pressure-sensitive sensor 50, located on a side of the sensing surface 50Sa, is referred to as a front surface, and the other main surface located on a side of the back surface 50Sb is referred to as a back surface.

The conductor base material 51 and the sensor layer 60 are disposed so as to be spaced apart from each other by a predetermined distance such that the front surface of the conductor base material 51 faces the back surface of the sensor layer 60. The sensor layer 60 and the conductor base material 56 are disposed so as to be spaced apart from each other by a predetermined distance such that the front surface of the sensor layer 60 faces the back surface of the conductor base material 56. By disposing the conductor base materials 51 and 56 on both main surface sides of the sensor layer 60 in this manner, entry of external noise (external electric field) into the pressure-sensitive sensor 50 can be suppressed.

The plurality of structures 52 and 53 is disposed between the conductor base material 51 and the sensor layer 60, and the conductor base material 51 and the sensor layer 60 are held by these structures 52 and 53 while being spaced apart from each other by a predetermined distance. The plurality of structures 54 and 55 is disposed between the sensor layer 60 and the conductor base material 56, and the sensor layer 60 and the conductor base material 56 are held by these structures 54 and 55 while being spaced apart from each other by a predetermined distance.

Conductor Base Material

Figure 5:
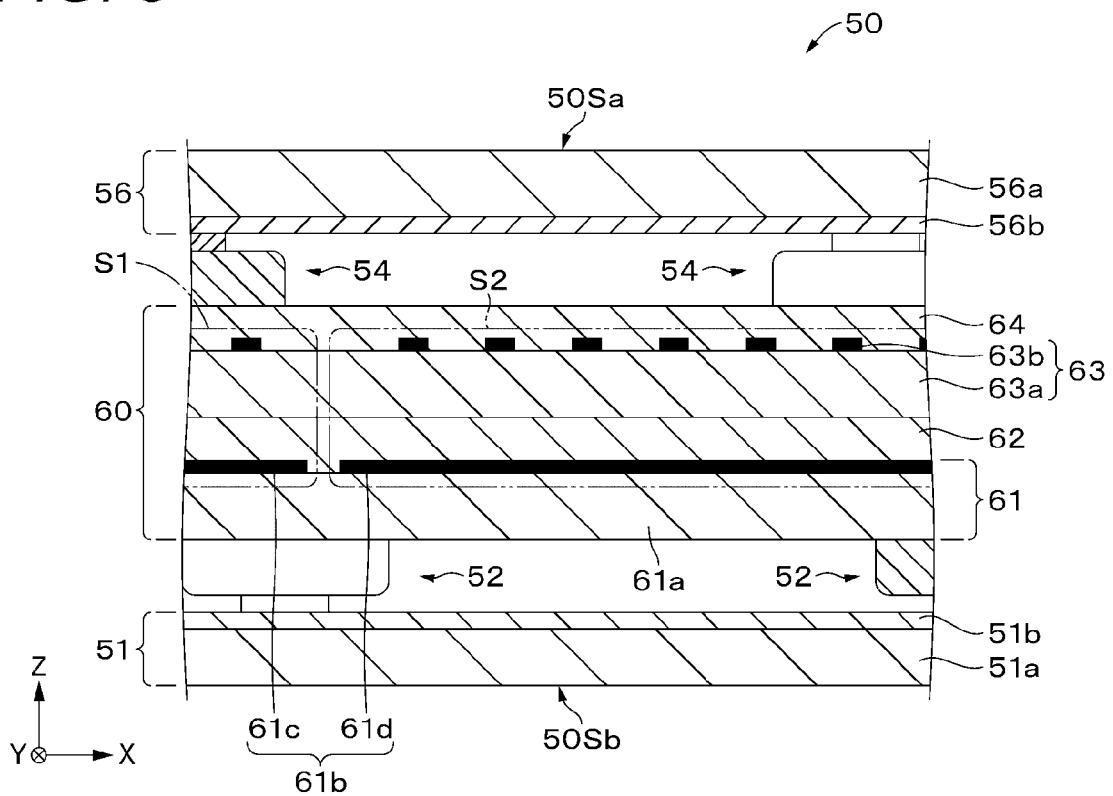
FIG. 5 is a cross-sectional view illustrating a configuration of a conductor base material and a sensor layer.

The conductor base material 51 constitutes the back surface 50Sb of the pressure-sensitive sensor 50. The conductor base material 56 constitutes the sensing surface 50Sa of the pressure-sensitive sensor 50. The conductor base materials 51 and 56 are connected to a ground potential. The conductor base material 51 is rigid or flexible, and as illustrated in FIG. 5, includes a base material 51a and a conductor layer 51b disposed on the back surface of the base material 51a. The conductor base material 51 has higher bending rigidity than the sensor layer 60, the conductor base material 56, and the like and may function as a fixing plate of the pressure-sensitive sensor 50. As illustrated in FIG. 5, the conductor base material 56 includes a base material 56a and a conductor layer 56b disposed on the back surface of the base material 56a. The conductor base material 56 is flexible and can be deformed according to pressing of the sensing surface 50Sa of the pressure-sensitive sensor 50.

The base materials 51a and 56a each have, for example, a film shape or a plate shape. Examples of materials of the base materials 51a and 56a include a polymer resin and glass. Examples of the polymer resin include polyethylene terephthalate (PET), polyethylene naphthalate (PEN), polycarbonate (PC), an acrylic resin (PMMA), polyimide (PI), triacetyl cellulose (TAC), polyester, polyamide (PA), aramid, polyethylene (PE), polyacrylate, polyether sulfone, polysulfone, polypropylene (PP), diacetyl cellulose, polyvinyl chloride, an epoxy resin, a urea resin, a urethane resin, a melamine resin, a cyclic olefin polymer (COP), and a norbornene-based thermoplastic resin.

As the conductor layer 51b or 56b, any layer may be used as long as having electric conductivity. Examples of the conductor layer 51b or 56b include an inorganic conductor layer containing an inorganic conductive material, an organic conductor layer containing an organic conductive material, and an organic-inorganic conductor layer containing both an inorganic conductive material and an organic conductive material.

Examples of the inorganic conductive material include a metal and a metal oxide. Here, it is defined that the metal includes a semimetal. Examples of the metal include metals such as aluminum, copper, silver, gold, platinum, palladium, nickel, tin, cobalt, rhodium, iridium, iron, ruthenium, osmium, manganese, molybdenum, tungsten, niobium, tantelum, titanium, bismuth, antimony, and lead, and alloys thereof, but are not limited thereto. Examples of the metal oxide include indium tin oxide (ITO), zinc oxide, indium oxide, antimony-added tin oxide, fluorine-added tin oxide, aluminum-added zinc oxide, gallium-added zinc oxide, silicon-added zinc oxide, a zinc oxide-tin oxide-based compound, an indium oxide-tin oxide-based compound, and a zinc oxide-indium oxide-magnesium oxide-based compound, but are not limited thereto.

Examples of the organic conductive material include a carbon material and a conductive polymer. Examples of the carbon material include carbon black, a carbon fiber, fullerene, graphene, a carbon nanotube, a carbon microcoil, and nanohorn, but are not limited thereto. Examples of the conductive polymer include substituted or unsubstituted polyaniline, polypyrrole, polythiophene, and a (co)polymer containing one or two kinds selected therefrom, but are not limited thereto.

Sensor Layer

The sensor layer 60 is a flexible layer having a film shape or a plate shape. As illustrated in FIG. 5, the sensor layer 60 includes an electrode base material 61, a pressure-sensitive adhesive layer 62, an electrode base material 63, and an insulating layer 64. The electrode base material 61 includes a base material 61a and a first electrode 61b which is an X electrode disposed on the front surface of the base material 61a. The electrode base material 63 includes a base material 63a and a second electrode 63b which is a Y electrode disposed on the front surface of the base material 63a. The front surface of the electrode base material 61 is bonded to the back surface of the electrode base material 63 with the pressure-sensitive adhesive layer 62. The insulating layer 64 is disposed on the front surface of the electrode base material 63 so as to cover the second electrode 63b.

Figure 6:
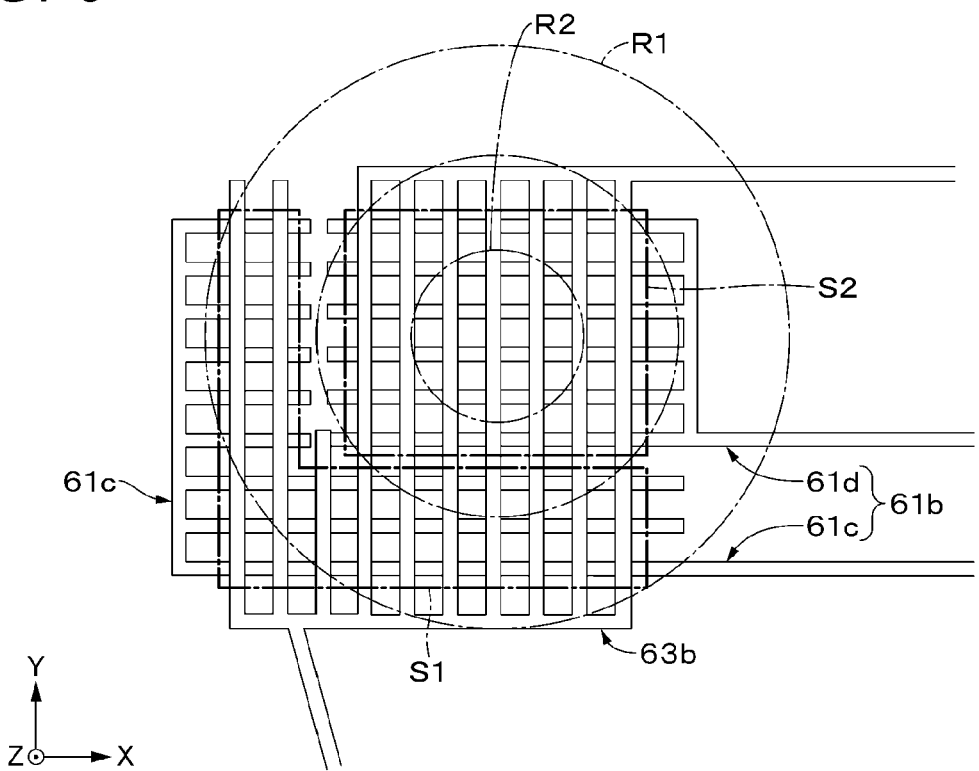
FIG. 6 is a plan view illustrating a configuration of first and second sensing units.

As illustrated in FIG. 6, the first and second sensing units S1 and S2 include the first electrode 61b which is a pulse electrode and the second electrode 63b which is a sense electrode. However, the first electrode 61b may be a sense electrode, and the second electrode 63b may be a pulse electrode.

Figure 7:
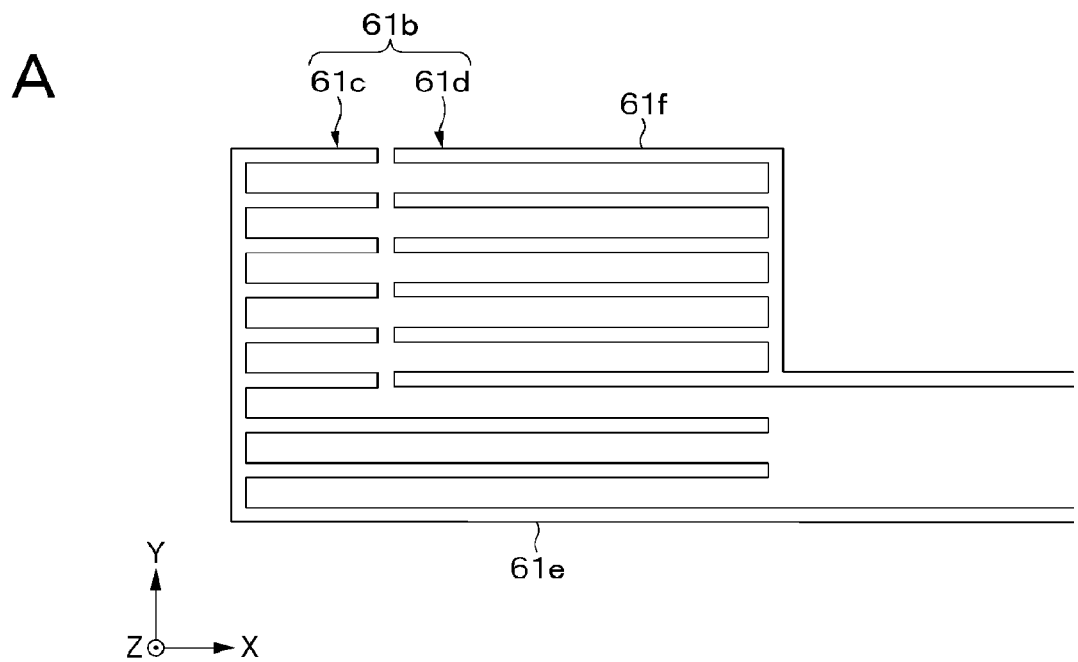
FIG. 7A is a plan view illustrating a configuration of a first electrode.
FIG. 7B is a plan view illustrating a configuration of a second electrode.
Figure 7:
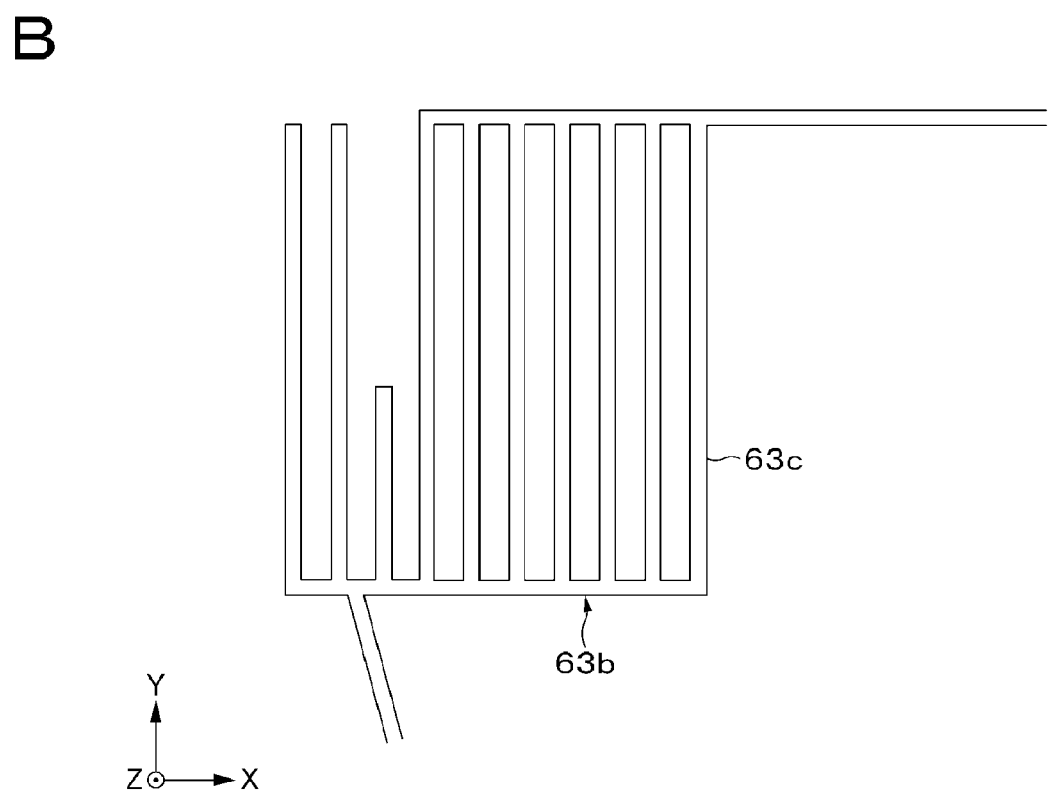

As illustrated in FIG. 7A, the first electrode 61b is different between the first and second sensing units S1 and S2, and includes two electrodes 61c and 61d. The electrodes 61c and 61d include a plurality of sub-electrodes 61e and 61f extended in an X direction, respectively. The electrode 61c is disposed in the first region R1, and the electrode 61d is disposed in the second region R2.

As illustrated in FIG. 7B, the second electrode 63b is shared by the first and second sensing units S1 and S2, and includes a plurality of sub-electrodes 63c extended in a Y direction. The second electrode 63b is disposed over both the first region R1 and the second region R2.

When the first and second electrodes 61b and 63b are viewed in plan view from a Z-axis direction, the sub-electrodes 61e and 63c orthogonally intersect with each other, and the sub-electrodes 61f and 63c orthogonally intersect with each other. The first sensing unit S1 includes the electrode 61c and the second electrode 63b facing each other in a thickness direction of the pressure-sensitive sensor 50. In addition, the second sensing unit S2 includes the electrode 61d and the second electrode 63b facing each other in the thickness direction of the pressure-sensitive sensor 50.

As described above, by making the first electrode 61b different (electrodes 61c and 61d) between the first and second sensing units S1 and S2, the detection accuracy for the touch operation and the push operation can be improved. Meanwhile, as described above, by making the second electrode 63b shared by the first and second sensing units S1 and S2, it is possible to realize the input device 40 which is relatively simple and has good volumetric efficiency.

Structure

As illustrated in FIGS. 4A and 4B, the structures 52 and 54 support any position within a region from an inner periphery of the first region R1 (that is, an inner periphery of the bottom 41c) to an outer periphery of the second region R2 (an outer periphery of a pressing region of the protruding portion 41d). The first and second regions R1 and R2 can be thereby separated from each other, and therefore the detection accuracy for the touch operation and the push operation can be improved. Note that FIGS. 4A and 4B illustrate an example of supporting the position of the inner periphery of the first region R1.

When the plurality of structures 52 and 54 is viewed in plan view from the Z-axis direction, as illustrated in FIG. 4B, the structures 52 and 54 are disposed at regular intervals so as to be alternately disposed. The structures 53 and 55 support positions outside the outer periphery of the first region R1. When the plurality of structures 52 and 53 is viewed in plan view from the Z-axis direction, the structures 53 and 55 are disposed at regular intervals so as to overlap each other.

As illustrated in FIGS. 4A and 4B, the structure 52 includes a structure unit 52a and a joint unit 52b. The structure unit 52a is a columnar body having a frustum shape, a cubic shape, a hemispherical shape, or the like. The joint unit 52b is disposed on a top of the structure unit 52a, and the structure unit 52a is bonded to the conductor base material 51 via the joint unit 52b. Examples of a material of the structure unit 52a include an insulating resin material. Examples of such a resin material include a photocurable resin such as an ultraviolet curable resin. Examples of a material of the joint unit 52b include an adhesive resin material.

Note that the configuration of the structure 52 is not limited to the configuration in which the structure unit 52a and the joint unit 52b are separated from each other as described above, and a configuration in which the structure unit 52a and the joint unit 52b are integrally formed in advance may be adopted. In this case, as a material of the structure 52, a material capable of realizing both the above-described functions of the structure unit 52a and the joint unit 52b is selected.

The structure 54 includes a structure unit 54a and a joint unit 54b. The joint unit 54b is disposed on a top of the structure unit 54a, and the structure unit 54a is bonded to the conductor base material 56 via the joint unit 54b. The structure 54 is similar to the structure 52 in points other than this point.

The configurations of the structures 53 and 55 are similar to those of the structures 52 and 54, respectively. However, the structure 52 may have a shape, a size, and the like different from the structure 53. Similarly, the structure 54 may have a shape, a size, and the like different from the structure 55.

First and Second Regions

Hereinafter, with reference to FIGS. 8A, 8B, 9A, and 9B, a pressure applied to the first region R1 when a user performs a touch operation on the button 42 and a pressure applied to the second region R2 when the user performs a push operation on the button 42 will be described.

Figure 8:
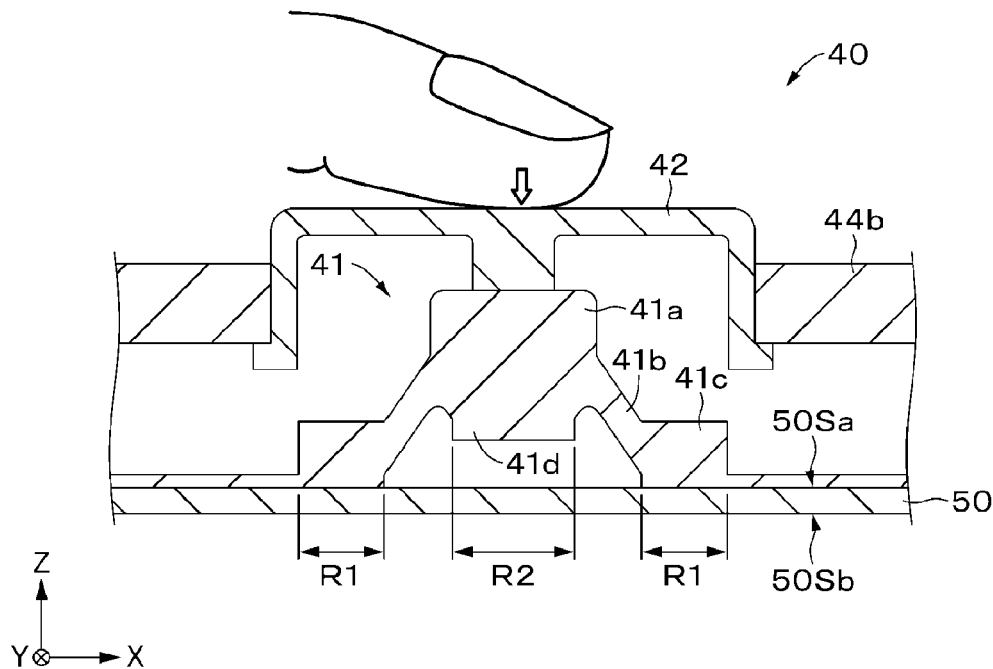
FIG. 8A is a cross-sectional view illustrating a state of a pressing unit during a touch operation.
FIG. 8B is a plan view for explaining a pressure applied to first and second regions during the touch operation.
Figure 8:
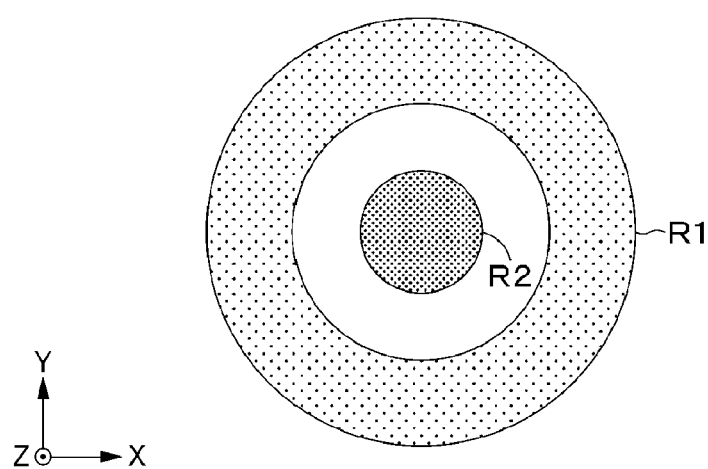
Figure 9:
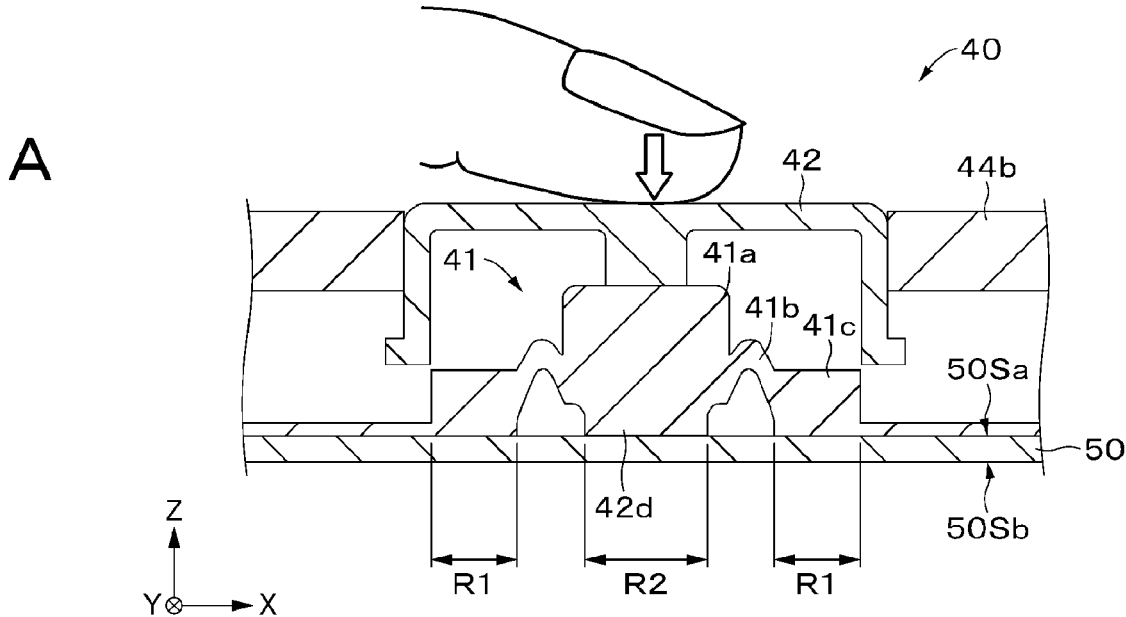
FIG. 9A is a cross-sectional view illustrating a state of a pressing unit during a push operation.
FIG. 9B is a plan view for explaining a pressure applied to first and second regions during the push operation.
Figure 9:
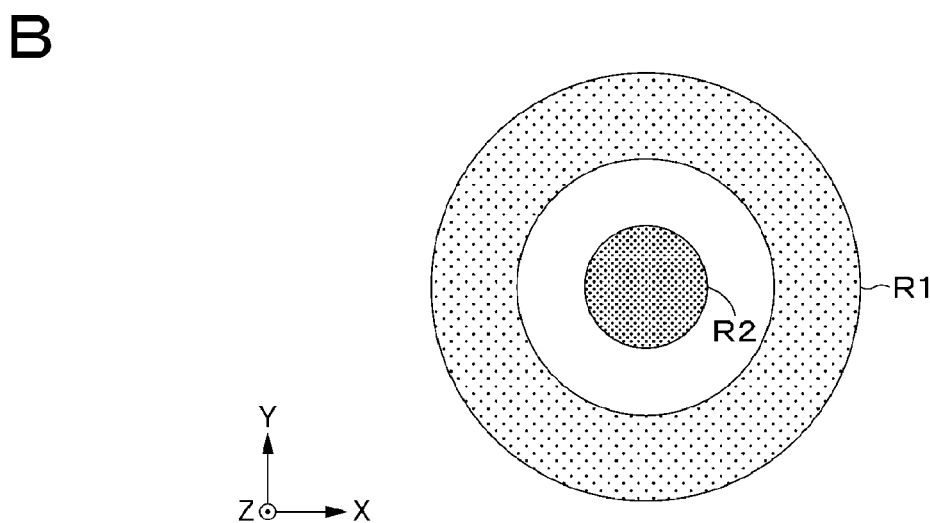

As illustrated in FIG. 8A, in a case where a user performs a touch operation on the button 42, the buckling unit 41b is hardly deformed, and the protruding portion 41d and the sensing surface 50Sa are not brought into contact with each other. Therefore, only the first region R1 of the sensing surface 50Sa is pressed by the bottom 41c. Therefore, an increase in pressure is detected in the first sensing unit S1, whereas an increase in pressure is not detected or hardly detected in the second sensing unit S2.

Meanwhile, as illustrated in FIG. 8B, in a case where a user performs a push operation on the button 42, the buckling unit 41b is largely deformed and deflected, a pressing force to the first region R1 is reduced, and the second region R2 is pressed by the protruding portion 41d. For this reason, a reduction in pressure is detected in the first region R1, whereas an increase in pressure is detected in the second region R2. Note that the pressure applied to the first region R1 tends to increase until the pressing unit 41 undergoes buckling deformation and tends to decrease after the pressing unit 41 undergoes buckling deformation. In addition, the pressure applied to the first region R1 is usually relatively smaller than the pressure applied to the second region R2.

Support

The support 43 supports the back surface 50Sb of the pressure-sensitive sensor 50. As the support 43, a support which is harder to be deformed than the pressure-sensitive sensor 50, that is, a support having higher rigidity than the pressure-sensitive sensor 50 is used. By supporting the back surface 50Sb of the pressure-sensitive sensor 50 by the support 43, the detection sensitivity of the pressure-sensitive sensor 50 can be improved. The support 43 includes, for example, a polymer resin layer, a metal layer, or a composite layer thereof.

Controller IC

The controller IC 45a judges whether a touch operation (first pressing operation) or a push operation (second push operation) has been performed on the button 42 (pressing unit 41) on the basis of changes $\Delta C1$ and $\Delta C2$ in electrostatic capacitance supplied from the pressure-sensitive sensor 50 (changes in pressure $\Delta P1$ and $\Delta P2$), and notifies the control unit 21 of the judgement result. Specifically, in a case where the change $\Delta C1$ in electrostatic capacitance supplied from the first sensing unit S1 (change in pressure $\Delta P1$) exceeds a threshold value A, the controller IC 45a notifies the control unit 21 on which button the touch operation has been performed. In a case where the change $\Delta C2$ in electrostatic capacitance supplied from the second sensing unit S2 (change in pressure $\Delta P2$) exceeds a threshold value B, the controller IC 45a notifies the control unit 21 on which button the push operation has been performed.

In the input device 40 having the above-described configuration, when the controller IC 45a applies a voltage to the first and second electrodes 61b and 63b, the sub-electrodes 61e and 63c adjacent to each other form capacitive coupling, and the sub-electrodes 61f and 63c adjacent to each other form capacitive coupling.

When a touch operation is performed on the button 42 while a voltage is applied between the first and second electrodes 61b and 63b, the conductor base material 56 is pressed and deformed by the bottom 41c to approach the first sensing unit S1. In addition, the sensor layer 60 is pressed and deformed by the structure 54 to approach the first conductor base material 51. Therefore, the electrostatic capacitance between the facing sub-electrodes 61e and 63c changes, and the electrostatic capacitance of the entire first sensing unit S1 changes. The controller IC 45a judges whether or not a touch operation has been performed on an operation surface of the button 42 on the basis of whether or not the change $\Delta C1$ in electrostatic capacitance of the entire first sensing unit S1 exceeds the threshold value A.

When a push operation is performed on the button 42 while a voltage is applied between the first and second electrodes 61b and 63b, the buckling unit 41b undergoes buckling deformation, and the conductor base material 56 is pressed and deformed by the protruding portion 41d to approach the second sensing unit S2. In addition, the sensor layer 60 is pressed and deformed by the structure 54 to approach the first conductor base material 51. Therefore, the electrostatic capacitance between the facing sub-electrodes 61f and 63c changes, and the electrostatic capacitance of the entire second sensing unit S2 changes. The controller IC 45a judges whether or not a push operation has been performed on an operation surface of the button 42 on the basis of whether or not the change $\Delta C2$ in electrostatic capacitance of the entire second sensing unit S2 exceeds the threshold value B.

3 Outline of Operation of Electronic Apparatus

Hereinafter, with reference to FIGS. 10A to 10C and FIGS. 11A to 11C, an example in which a menu screen 33a displayed on the display device (display) 33 is wirelessly operated by the operation device 20 will be described.

When a user sequentially swipes operation surfaces of the plurality of buttons 42 lightly (with a light load) in the direction of the arrow DA1 or DA2 as illustrated in FIGS. 10B and 10C, the menu screen 33a is moved in the direction of the swipe in accordance therewith and scrolls in the direction of the arrow DB1 or DB2 as illustrated in FIG. 10A. At the time of scrolling, a selection number 33b is largely emphasized at the center of the menu screen 33a as compared with other numerical value. Note that the swipe is an example of a touch operation.

Here, for easy explanation, an example in which numbers are displayed on the menu screen 33a will be described. However, normally, a plurality of setting items and the like are displayed together with numerical values or instead of the numbers, and these setting items are scrolled. Hereinafter, on the basis of any one of the buttons 42, a button adjacent thereto in the direction of the arrow DA1 is referred to as a "right adjacent button 42", and a button adjacent thereto in the direction of the arrow DA2 is referred to as a "left adjacent button 42". In addition, screen scrolling in the direction of the arrow DB1 is referred to as "right scrolling", and screen scrolling in the direction of the arrow DB2 is referred to as "left scrolling".

When a desired number is displayed as the selection number 33b by the scrolling operation, a user performs a push operation on the button 42 to push the button 42 as illustrated in FIGS. 11B and 11C. As a result, an instruction to determine the selection number 33b is issued, and the selection number 33b is further emphasized as illustrated in FIG. 11A.

4 Operation of Controller IC of Input Device

Hereinafter, an operation of the controller IC 45a of the input device 40 will be described with reference to FIG. 12.

First, in step S1, the controller IC 45a sequentially scans the first and second sensing units S1 and S2 of each of the buttons 42 to detect the changes ΔC1 and ΔC2 in electrostatic capacitance. Subsequently, in step S2, the controller IC 45a judges whether or not the change ΔC1 in electrostatic capacitance of the first sensing unit S1 detected in step S1 exceeds the threshold A.

In step S2, in a case where the controller IC 45a judges that the change ΔC1 in electrostatic capacitance exceeds the threshold value A, in step S3, the controller IC 45a notifies the control unit 21 on which of the buttons 42 the touch operation has been performed. Meanwhile, in step S2, in a case where the controller IC 45a judges that the change ΔC1 in electrostatic capacitance does not exceed the threshold value A, in step S4, the controller IC 45a judges whether or not the change ΔC2 in electrostatic capacitance of the second sensing unit S2 detected in step S1 exceeds the threshold B.

In step S4, in a case where the controller IC 45a judges that the change ΔC2 in electrostatic capacitance exceeds the threshold value B, in step S5, the controller IC 45a notifies the control unit 21 on which of the buttons 42 the push operation has been performed. Meanwhile, in step S4, in a case where the controller IC 45a judges that the change ΔC2 in electrostatic capacitance does not exceed the threshold value B, the controller IC 45a returns the process to step S1 and executes the process.

5 Operation of Control Unit of Operation Device

Hereinafter, an operation of the control unit 21 of the operation device 20 will be described with reference to FIG. 13.

First, in step S11, the control unit 21 judges whether or not the control unit 21 has received notification of a push operation from the controller IC 45a. In step S11, in a case where the control unit 21 judges that the control unit 21 has received notification of a push operation, in step S12, the control unit 21 reads a control command corresponding to the button 42 on which the push operation has been performed from the storage device 23, and transmits the control command to the host apparatus 30 via the communication unit 22. Meanwhile, in step S11, in a case where the control unit 21 judges that the control unit 21 has not received notification of a push operation, in step S13, the control unit 21 judges whether or not the control unit 21 has received notification of a touch operation from the controller IC 45a.

In step S13, in a case where the control unit 21 judges that the control unit 21 has received notification of a touch operation, in step S14, the control unit 21 waits for a predetermined time, and then advances the process to step S15. Meanwhile, in step S13, in a case where the control unit 21 judges that the control unit 21 has not received notification of a touch operation, the control unit 21 returns the process to step S11.

Subsequently, in step S15, the control unit 21 judges whether or not the control unit 21 has received notification of a push operation from the controller IC 45a. In step S15, in a case where the control unit 21 judges that the control unit 21 has received notification of a push operation, in step S16, the control unit 21 reads a control command corresponding to the button 42 on which the push operation has been performed from the storage device 23, and transmits the control command to the host apparatus 30 via the communication unit 22. Meanwhile, in step S15, in a case where the control unit 21 judges that the control unit 21 has not received notification of a push operation, in step S17, the control unit 21 judges whether or not the control unit 21 has received notification of a touch operation from the controller IC 45a.

In step S17, in a case where the control unit 21 judges that the control unit 21 has received notification of a touch operation, in step S18, the control unit 21 judges whether or not the button 42 for which notification of the touch operation has been made this time is a left adjacent button 42 of the button 42 for which notification of the touch operation (step S13) has been made previously. Meanwhile, in step S17, in a case where the control unit 21 judges that the control unit 21 has not received notification of a touch operation, the control unit 21 returns the process to step S11.

In step S18, in a case where the control unit 21 judges that the button 42 for which notification of the touch operation has been made this time is the left adjacent button 42 of the button 42 for which notification of the touch operation has been made previously, in step S19, the control unit 21 reads a control command for requesting left scrolling to the host apparatus 30 from the storage device 23, and transmits the control command to the host apparatus 30 via the communication unit 22. Meanwhile, in step S18, in a case where the control unit 21 judges that the button 42 for which notification of the touch operation has been made this time is not the left adjacent button 42 of the button 42 for which notification of the touch operation has been made previously, in step S20, the control unit 21 judges whether or not the button 42 for which notification of the touch operation has been made this time is a right adjacent button 42 of the button 42 for which notification of the touch operation (step S13) has been made previously.

In step S20, in a case where the control unit 21 judges that the button 42 for which notification of the touch operation has been made this time is the right adjacent button 42 of the button 42 for which notification of the touch operation has been made previously, in step S21, the control unit 21 reads a control command for requesting right scrolling to the host apparatus 30 from the storage device 23, and transmits the control command to the host apparatus 30 via the communication unit 22. Meanwhile, in step S20, in a case where the control unit 21 judges that the button 42 for which notification of the touch operation has been made this time is not the right adjacent button 42 of the button 42 for which notification of the touch operation has been made previously, the control unit 21 returns the process to step S11.

6 Effect

The input device 40 according to an embodiment of the present technology includes the pressure-sensitive sensor 50 including the first sensing unit S1 and the second sensing unit S2, and the pressing unit 41 that is disposed on the pressure-sensitive sensor 50 and undergoes buckling deformation. The bottom 41c of the pressing unit 41 is disposed on the first sensing unit S1, and a top of the pressing unit 41 is disposed on the second sensing unit S2. Therefore, the controller IC 45a can discriminate between a touch operation and a push operation on the pressing unit 41 on the basis of a change in pressure supplied from the first and second sensing units S1. Therefore, it is possible to realize the input device 40 capable of performing two kinds of operations with the same pressing unit 41.

The input device 40 can discriminate between a touch operation and a push operation only with the one pressure-sensitive sensor 50. Therefore, unlike the invention described in the citation list 1, it is not necessary to provide a different sensor means for discriminating between a touch operation and a push operation, and therefore the configuration of the device can be simplified.

Since the configuration in which the pressure-sensitive sensor 50 is pressed via the pressing unit 41 is adopted, it is also possible to detect a touch operation with a glove attached.

7 Modified Example

Instead of including the plurality of structures 54 (see FIGS. 4A and 4B) between the sensor layer 60 and the conductor base material 56, as illustrated in FIGS. 14A and 14B, the pressure-sensitive sensor 50 may include the one ring-shaped structure 57 between the sensor layer 60 and the conductor base material 56. The structure 57 includes a structure unit 57a and a joint unit 57b. The structure unit 57a and the joint unit 57b are similar to the structure unit 54a and the joint unit 54b, respectively, except for having a ring shape. In this case, the pressure-sensitive sensor 50 does not need to include the structure 52 between the conductor base material 51 and the sensor layer 60. Even in a case where the pressure-sensitive sensor 50 has the configuration, similarly to the above-described pressure-sensitive sensor 50 according to an embodiment, the detection accuracy for the touch operation and the push operation can be improved by separating the first and second regions R1 and R2 from each other.

Instead of the configuration in which the input device 40 includes the conductor base materials 56 and 51 (see FIGS. 4A and 4B) on the front and back surfaces of the sensor layer 60, respectively, as illustrated in FIGS. 15A and 15B, a configuration in which the input device 40 includes the conductor base material 56 only on the front surface side of the sensor layer 60 may be adopted.

As illustrated in FIGS. 16A and 16B, the structure 54 supports the bottom 41c of the pressing unit 41, and the structure 52 does not need to be disposed between the conductor base material 51 and the sensor layer 60. In the case of the above configuration, deformation of the sensor layer 60 by the bottom 41c is promoted, and hindrance to deformation of the conductor base material 56 and the sensor layer 60 by the protruding portion 41d can be suppressed.

As illustrated in FIG. 17, when the first and second sensing units S1 and S2 are viewed in plan view from the Z direction, the first sensing units S1 may be disposed on both sides of the second sensing unit S2. In this case, as illustrated in FIG. 18A, as the electrode 61c, it is possible to use a comb-teeth-shaped electrode in which the sub-electrode 61e at the center portion is missing, and as the electrode 61d, it is possible to use a comb-teeth-shaped electrode. The electrode 61d is disposed in the missing portion of the electrode 61c. As the second electrode 63b, as illustrated in FIG. 18B, it is possible to use a net-shaped electrode having the sub-electrode 63c orthogonal to the sub-electrodes 61e and 61f of the electrodes 61c and 61d. However, the shapes of the electrodes 61c and 61d and the second electrode 63b are examples, and are not limited thereto.

As illustrated in FIG. 19, when the first and second sensing units S1 and S2 are viewed in plan view from the Z direction, the first sensing unit S1 may have an annular shape, and the second sensing unit S2 may have a circular shape. In this case, as illustrated in FIG. 20A, as the electrode 61c, it is only required to use an annular electrode having an opening with substantially the same size as the second region R2 and having an outer diameter with substantially the same size as the first region R1, and as the electrode 61d, it is only required to use a circular electrode with substantially the same size as the second region R2. In addition, as illustrated in FIG. 20B, as the second electrode 63b, it is only required to use a circular electrode or a partially cut out circular electrode with substantially the same size as the outer periphery of the second region R2. However, the shapes of the electrodes 61c and 61d and the second electrode 63b are examples, and are not limited thereto.

In the above-described embodiment, the configuration in which the operation device 20 is disposed as a peripheral apparatus outside the host apparatus 30 and these devices exchange information wirelessly has been described. However, a configuration in which the operation device 20 and the host apparatus 30 are integrated with each other and these devices are connected by wires may be adopted.

In a case where the controller IC 45a judges that a touch operation has been performed on the basis of a change in pressure supplied from the pressure-sensitive sensor 50 (change in electrostatic capacitance), the controller IC 45a may output position information of the button 42 on which the touch operation has been performed to the host apparatus 30 via the control unit 21 and the communication unit 22. In this case, the control unit 31 may receive the position information via the communication unit 32, and may execute a process such as a scrolling operation of a screen displayed on the display device 33 or movement of a cursor on the basis of the position information.

As the pressure-sensitive sensor 50, a piezoelectric element (piezo element) or a pressure-sensitive rubber sensor may be used instead of the electrostatic capacitance type sensor. However, when it is tried to detect each of the pressures of the first and second regions R1 and R2 using a piezoelectric element or a pressure-sensitive rubber sensor as the pressure-sensitive sensor 50, it is usually necessary to dispose the piezoelectric element or the pressure-sensitive rubber sensor independently in each of the first and second regions R1 and R2. For this reason, there is a possibility that the configuration of the input device 40 becomes complicated or increases. Meanwhile, when the electrostatic capacitance type pressure-sensitive sensor 50 used in an embodiment is used as the pressure-sensitive sensor 50, it is possible to realize the input device 40 which is relatively simple and has good volumetric efficiency.

In the above-described embodiment, the configuration in which the input device 40 includes the controller IC 45a as a control unit has been described. However, the controller IC 45a is not indispensable for the input device 40 but is disposed as necessary. In a case where the input device 40 does not include the controller IC 45a, a device for receiving an output signal of the input device 40 only needs to include the controller IC 45a.

The input device 40 may include one of the buttons 42, that is, one of the pressing units 41.

As illustrated in FIG. 21A, a pressing unit 71 may be constituted by a dome-shaped metal thin plate, a dome-shaped polymer resin film, or the like, or as illustrated in FIG. 21B, the pressing unit 71 may be constituted by a frustum-shaped metal thin plate, a frustum-shaped polymer resin film, or the like.

The pressing unit 41 does not need to have the protruding portion 41d. However, as in the above-described embodiment, the pressing unit 41 preferably includes the protruding portion 41d from a viewpoint of the detection accuracy for a push operation.

The base materials 51a and 56a are disposed as necessary, and do not need to be disposed.

The support 43 is disposed as necessary, and does not need to be disposed.

A sensor layer in which the first and second electrodes are disposed on the same surface of a base material may be used. In this case, it is only required to alternately dispose sub-electrodes of the first and second electrodes on the same surface of the base material at predetermined intervals.

In the above-described embodiment, the case where the electronic apparatus 10 is a television device has been described as an example, but the present technology is not limited thereto, and can be applied to various electronic apparatuses each including the input device 40 including the pressing unit 41. For example, the present technology can be applied to a personal computer, a mobile phone such as a smartphone, a tablet computer, a camera, a game apparatus, a navigation system, an electronic book, an electronic dictionary, a portable music player, a wearable terminal such as a smart watch or a head mound display, a radio, a power tool, a refrigerator, an air conditioner, a wearable apparatus, a stereo, a water heater, a microwave oven, a dishwasher, a washing machine, a dryer, a lighting apparatus, a toy, a medical apparatus, a robot, and the like. Note that the electronic apparatus also includes a so-called electrical apparatus.

In addition, the present technology is not limited to the electronic apparatus, but can be applied to various ones other than the electronic apparatus. For example, the present technology can be applied to a vehicle, a manufacturing device, an analytical apparatus, and the like. Examples of the vehicle include a wheeled vehicle (for example, a car or a motorcycle), a ship, a submarine, a railroad wheeled vehicle, an aircraft, a spacecraft, an elevator, and a plaything.

Hereinabove, the embodiments of the present technology have been described specifically. However, the present technology is not limited to the above-described embodiments, but various modifications based on a technical idea of the present technology can be made.

For example, the configurations, the methods, the steps, the forms, the materials, the numerical values, and the like exemplified in the above-described embodiments are only examples, and a configuration, a method, a step, a form, a material, a numerical value, and the like different therefrom may be used, as necessary.

In addition, the configurations, the methods, the steps, the forms, the materials, the numerical values, and the like in the above-described embodiments can be combined with each other as long as not departing from the gist of the present technology.

In addition, the present technology can adopt the following configurations.

(1)
An input device including:
a pressure-sensitive sensor including a first sensing unit and a second sensing unit; and
a pressing unit that is disposed on the pressure-sensitive sensor and undergoes buckling deformation, in which
a bottom of the pressing unit is disposed on the first sensing unit, and
a top of the pressing unit is disposed on the second sensing unit.

(2)
The input device according to (1), in which the pressing unit has a protruding portion protruding toward the second sensing unit.

(3)
The input device according to (1) or (2), in which the pressure-sensitive sensor is an electrostatic capacitance type pressure-sensitive sensor.

(4)
The input device according to (3), in which
the first sensing unit and the second sensing unit include a pulse electrode and a sense electrode, and
one of the pulse electrode and the sense electrode is shared by the first sensing unit and the second sensing unit, and the other is different between the first sensing unit and the second sensing unit.

(5)
The input device according to (3) or (4), in which
the pressure-sensitive sensor includes:
a conductor layer deformed by pressing of the pressing unit;
a sensor layer including the first sensing unit and the second sensing unit; and
a structure disposed between the conductor layer and the sensor layer.

(6)
The input device according to (3) or (4), in which
the pressure-sensitive sensor includes:
a first conductor layer;
a second conductor layer deformed by pressing of the pressing unit;
a sensor layer disposed between the first conductor layer and the second conductor layer and including the first sensing unit and the second sensing unit;
a first structure unit disposed between the first conductor layer and the sensor layer; and
a second structure unit disposed between the second conductor layer and the sensor layer.

(7)
The input device according to (5), in which
the pressing unit has a protruding portion that presses the pressure-sensitive sensor during buckling deformation, and
the structure supports any position within a region from an inner periphery of a bottom of the pressing unit to an outer periphery of a pressing region of the protruding portion.

(8)
The input device according to (5), in which the structure unit supports a bottom of the pressing unit.

(9)
The input device according to any one of (1) to (8), further including a control unit for discriminating a first pressing operation on the basis of an output signal from the first sensing unit and discriminating a second pressing operation on the basis of an output signal from the second sensing unit.

(10)
An operation device including the input device according to any one of (1) to (9).

(11)
An electronic apparatus including the input device according to any one of (1) to (9).

(12)
An electronic apparatus including:
an operation device including an input device; and
a host apparatus that operates on the basis of an output signal from the operation device, in which
the input device includes:
a pressure-sensitive sensor including a first sensing unit and a second sensing unit; and
a pressing unit that is disposed on the pressure-sensitive sensor and undergoes buckling deformation,
a bottom of the pressing unit is disposed on the first sensing unit, and
a top of the pressing unit is disposed on the second sensing unit.
(13)
The electronic apparatus according to (12), in which
the host apparatus includes:
a display device; and
a control unit for controlling screen display on the display device on the basis of an output signal from the operation device.
(14)
The electronic apparatus according to (13), in which control of the screen display is control of a screen scrolling operation.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

REFERENCE SIGNS LIST

10 Electronic apparatus
20 Operation device
21, 31 Control unit
30 Host apparatus
33 Display device
40 Input device
41 Pressing unit
41a Pusher
41b Buckling unit
41c Bottom
41d Protruding portion
45a Controller IC (control unit)
50 Pressure-sensitive sensor
60 Sensor layer
51, 56 Conductor base material
51b, 56b Conductor layer
52, 53, 54, 55 Structure
61b First electrode
63b Second electrode
61c, 61d Electrode
S1 First sensing unit
S2 Second sensing unit

The invention claimed is:

1. An input device comprising: a pressure-sensitive sensor including a first sensing unit and a second sensing unit; and a pressing unit that is disposed on the pressure-sensitive sensor and undergoes buckling deformation, wherein a bottom of the pressing unit is disposed on the first sensing unit, and a top of the pressing unit is disposed on the second sensing unit, wherein the pressure-sensitive sensor is an electrostatic capacitance type pressure-sensitive sensor, wherein the first sensing unit and the second sensing unit include a pulse electrode and a sense electrode, and wherein one of the pulse electrode and the sense electrode is shared by the first sensing unit and the second sensing unit, and the other of the pulse electrode and the sense electrode is in a split configuration between the first sensing unit and the second sensing unit.

2. The input device according to claim 1, wherein the pressing unit has a protruding portion protruding toward the second sensing unit.

3. The input device according to claim 1, further comprising a control unit for discriminating a first pressing operation on the basis of an output signal from the first sensing unit and discriminating a second pressing operation on the basis of an output signal from the second sensing unit.

4. An operation device comprising the input device according to claim 1.

5. An electronic apparatus comprising the input device according to claim 1.

6. An electronic apparatus comprising:
an operation device including the input device according to claim 1; and
a host apparatus that operates on the basis of an output signal from the operation device, wherein
the input device includes:
a pressure-sensitive sensor including a first sensing unit and a second sensing unit; and
a pressing unit that is disposed on the pressure-sensitive sensor and undergoes buckling deformation,
a bottom of the pressing unit is disposed on the first sensing unit, and
a top of the pressing unit is disposed on the second sensing unit.

7. The electronic apparatus according to claim 6, wherein the host apparatus includes:
a display device; and
a control unit for controlling screen display on the display device on the basis of an output signal from the operation device.

8. The electronic apparatus according to claim 7, wherein control of the screen display is control of a screen scrolling operation.

9. An input device comprising:
a pressure-sensitive sensor including a first sensing unit and a second sensing unit; and
a pressing unit that is disposed on the pressure-sensitive sensor and undergoes buckling deformation, wherein
a bottom of the pressing unit is disposed on the first sensing unit, and
a top of the pressing unit is disposed on the second sensing unit, wherein
the pressure-sensitive sensor includes:
a conductor layer deformed by pressing of the pressing unit;
a sensor layer including the first sensing unit and the second sensing unit; and
a structure disposed between the conductor layer and the sensor layer, and wherein the pressure-sensitive sensor is an electrostatic capacitance type pressure-sensitive sensor.

10. The input device according to claim 9, wherein
the pressing unit has a protruding portion that presses the pressure-sensitive sensor during buckling deformation, and the structure supports any position within a region from an inner periphery of a bottom of the pressing unit to an outer periphery of a pressing region of the protruding portion.

11. The input device according to claim 9, wherein the structure supports a bottom of the pressing unit.

12. An operation device comprising the input device according to claim 9.

13. An electronic apparatus comprising the input device according to claim 9.

14. An electronic apparatus comprising:
an operation device including the input device according to claim 9; and
a host apparatus that operates on the basis of an output signal from the operation device, wherein
the input device includes:
a pressure-sensitive sensor including a first sensing unit and a second sensing unit; and
a pressing unit that is disposed on the pressure-sensitive sensor and undergoes buckling deformation,
a bottom of the pressing unit is disposed on the first sensing unit, and
a top of the pressing unit is disposed on the second sensing unit.

15. An input device comprising:
a pressure-sensitive sensor including a first sensing unit and a second sensing unit; and
a pressing unit that is disposed on the pressure-sensitive sensor and undergoes buckling deformation, wherein
a bottom of the pressing unit is disposed on the first sensing unit, and
a top of the pressing unit is disposed on the second sensing unit, wherein
the pressure-sensitive sensor includes:
a first conductor layer;
a second conductor layer deformed by pressing of the pressing unit;
a sensor layer disposed between the first conductor layer and the second conductor layer and including the first sensing unit and the second sensing unit;
a first structure disposed between the first conductor layer and the sensor layer; and
a second structure disposed between the second conductor layer and the sensor layer, and
wherein the pressure-sensitive sensor is an electrostatic capacitance type pressure-sensitive sensor.

16. An operation device comprising the input device according to claim 15.

17. An electronic apparatus comprising the input device according to claim 15.

18. An electronic apparatus comprising:
an operation device including the input device according to claim 15; and
a host apparatus that operates on the basis of an output signal from the operation device, wherein
the input device includes:
a pressure-sensitive sensor including a first sensing unit and a second sensing unit; and
a pressing unit that is disposed on the pressure-sensitive sensor and undergoes buckling deformation,
a bottom of the pressing unit is disposed on the first sensing unit, and
a top of the pressing unit is disposed on the second sensing unit.

* * * * *